(12) United States Patent
Rupich et al.

(10) Patent No.: US 7,261,776 B2
(45) Date of Patent: Aug. 28, 2007

(54) DEPOSITION OF BUFFER LAYERS ON TEXTURED METAL SURFACES

(75) Inventors: Martin W. Rupich, Framingham, MA (US); Urs-Detlev Schoop, Tucson, AZ (US); Darren Verebelyi, Oxford, MA (US); Thomas Kodenkandath, North Grafton, MA (US); Xiaoping Li, Westborough, MA (US)

(73) Assignee: American Superconductor Corporation, Westborough, MA (US)

( * ) Notice: Subject to any disclaimer, the term of this patent is extended or adjusted under 35 U.S.C. 154(b) by 289 days.

(21) Appl. No.: 10/812,676

(22) Filed: Mar. 30, 2004

(65) Prior Publication Data

US 2005/0217568 A1  Oct. 6, 2005

(51) Int. Cl.
*C30B 29/16* (2006.01)

(52) U.S. Cl. ............... 117/89; 117/90; 117/91; 505/929

(58) Field of Classification Search .......... 117/89, 117/90, 91; 505/929
See application file for complete search history.

(56) References Cited

U.S. PATENT DOCUMENTS

| 5,231,074 | A | 7/1993 | Cima et al. |
|---|---|---|---|
| 5,340,794 | A | 8/1994 | Tallon et al. |
| 6,022,832 | A | 2/2000 | Fritzemeier et al. |
| 6,027,564 | A | 2/2000 | Fritzemeir et al. |
| 6,077,344 | A | 6/2000 | Schoup et al. |
| 6,190,752 | B1 | 2/2001 | Do et al. |
| 6,202,287 | B1 | 3/2001 | Otto |
| 6,399,154 | B1 | 6/2002 | Williams et al. |
| 6,428,635 | B1 | 8/2002 | Fritzemeier et al. |
| 6,440,211 | B1 | 8/2002 | Beach et al. |
| 6,451,450 | B1 * | 9/2002 | Goyal et al. ............. 428/629 |
| 6,458,223 | B1 | 10/2002 | Hans Thieme et al. |
| 6,475,311 | B1 | 11/2002 | Fritzemeier et al. |
| 6,537,689 | B2 | 3/2003 | Schoop et al. |
| 6,562,761 | B1 | 5/2003 | Fritzemeier et al. |
| 6,573,209 | B1 * | 6/2003 | Sambasivan et al. ..... 501/96.1 |

(Continued)

FOREIGN PATENT DOCUMENTS

WO    98/58415    12/1998

(Continued)

OTHER PUBLICATIONS

Lee, Dominic F., et al., Alternative Buffer Architectures for High Critical Current Density YBCO Superconducting Deposits on Rolling Assisted Biaxially-Textured Substrates, Jpn. J. Appl. Phys., vol. 38, (Feb. 1999), 178-180.

(Continued)

*Primary Examiner*—Robert Kunemund
(74) *Attorney, Agent, or Firm*—Wilmer Cutler Pickering Hale and Dorr, LLP

(57) ABSTRACT

A method of making a multilayer article includes depositing a first material on the surface of a metal substrate to form a seed layer of the first material, the first material being deposited under reducing conditions relative to the metal substrate, and then epitaxially depositing a second material on a surface of the seed layer, wherein the second material is deposited from a solution-based precursor under second conditions that are more oxidizing than the reducing conditions used in the deposition of the first material.

39 Claims, 9 Drawing Sheets

U.S. PATENT DOCUMENTS

| | | | |
|---|---|---|---|
| 6,602,588 | B1 | 8/2003 | Kwon et al. |
| 6,617,283 | B2 | 9/2003 | Paranthaman et al. |
| 6,624,122 | B1 | 9/2003 | Holesinger et al. |
| 6,645,639 | B1 * | 11/2003 | Sambasivan et al. ....... 428/469 |
| 6,669,774 | B1 | 12/2003 | Zhang et al. |
| 6,673,387 | B1 * | 1/2004 | Zhang et al. ................. 427/62 |
| 6,730,410 | B1 | 5/2004 | Fritzemeier et al. |
| 6,745,059 | B2 | 6/2004 | Buczek et al. |
| 6,797,313 | B2 | 9/2004 | Fritzemeier et al. |
| 6,828,507 | B1 | 12/2004 | Fritzemeier et al. |
| 6,974,501 | B1 | 12/2005 | Zhang et al. |
| 2002/0056401 | A1 | 5/2002 | Rupich et al. |
| 2002/0178999 | A1 | 12/2002 | Beach et al. |
| 2002/0197501 | A1 * | 12/2002 | Robbins .................... 428/621 |
| 2003/0130129 | A1 | 7/2003 | Seleznev et al. |
| 2005/0016759 | A1 | 1/2005 | Malozemoff et al. |
| 2005/0159298 | A1 | 7/2005 | Rupich et al. |

FOREIGN PATENT DOCUMENTS

| | | |
|---|---|---|
| WO | 99/25908 | 5/1999 |
| WO | 01/08236 | 2/2001 |

OTHER PUBLICATIONS

Beach, David B., et al., Sol-Gel Synthesis of Rare Earth Aluminate Films as Buffer Layers for High Tc Superconducting Films, Mat. Res. Soc. Symp. Proc., vol. 495 (1998), 263-276.

Paranthaman, M., et al., Growth of Biaxially Textured RE2O3 Buffer Layers on Rolled-Ni Substrates Using Reactive Evaporation for HTS-Coated Conductors, Supercond. Sci. Technol. 12 (1999) 319-325.

Wu, X., et al., Properties of YBa2Cu3O7-8 Thick Films on Flexible Buffered Metallic Substrates, Appl. Phys. Lett. 67 No. 6:2397 (Oct. 1995).

Shoup, S., et al., Epitaxial Thin Film Growth of Lanthanum and Neodymium Aluminate Films on Roll-Textured Nickel Using a Sol-Gel Method, J. Am. Cer. Soc., vol. 81, 3019-3021 (1998).

Rupich, M., et al., Growth and Characterization of Oxide Buffer Layers for YBCO Coated Conductors, I.E.E.E. Trans. on Appl. Supercon., vol. 9, (1999) 1527-1530.

Celik, E., et al., Processing Dependence of Texture Development in La2Zr2O7 Buffer Layer by Sol-Gel Technique for YBCO Coated Conductors, vol. 48 (2002) 503-510, Proc. Intl. Cryo. Mats. Conf.-ICMC.

Jacobsen, S., et al., Sharp Microfaceting of (001)-Oriented Cerium Dioxide Thin Films and the Effect of Annealing on Surface Morphology, Surface Science 429 (1999).

Jacobsen, S., et al., Epitaxial cerium oxide buffer layers and YBa2Cu3O7-8 thin films for microwave device applications, J. Mater. Res., vol. 14, No. 6 (Jun. 1999) 2385-2393.

U.S. Appl. No. 08/943,047, filed Oct. 1, 1997, Thieme.

U.S. Appl. No. 09/007,373, filed Jan. 15, 1998, Fritzemeier et al.

U.S. Appl. No. 60/447,613, filed Jun. 10, 2003, Rupich et al.

European Patent Office, International Search Report of PCT/US2005/010593 mailed Nov. 14, 2005, 3 pages.

Paranthaman, M. et al., "Growth of Textured Buffer Layers and Superconductors on Rolled Ni Substrates Using Sol-gel Alkoxide Precursors", Ninth CIMTEC World Ceramics Contress and Forum on New Materials, Florence, Italy, 1998, pp. 185-192.

Paranthaman, S. et al., "Epitaxial Growth of BaZrO3 Films on Single Crystal Oxide Substrates Using Sol-Gel Alkoxide Precursors", Mater. Res. Bull., vol. 32, No. 12, 1997, pp. 1697-1704.

Sathyamurthy et al, "Application of Metal-Organic Decomposition Techniques for the Deposition of Buffer Layers and Y123 for Coated-Conductor Fabrication", Physica C (Netherlands), 2000, vol. 329, pp. 58-68

Sathyamurthy et al, "Chemical Solution Deposition of Highly Oriented Strontium Titanate Buffer Layers for Coated Conductors", Superscond. Sci. Technol., 2000, vol. 13, pp. L1-L3.

Schwartz, "Control of Microstructures and Orientation in Solution-Deposited BaTiO3 and Sr TiO3 Thin Films", J. Am. Ceram. Soc., 1999, vol. 82, No. 9, pp. 2359-2367.

Shoup et al, "Sol-Gel Synthesis of LaAlO3; Epitaxial Growth of LaAlO3 Thin Films on SrTiO3(100)", J. Mat. Research, 1997, vol. 12, pp. 1017-1221.

* cited by examiner

DEPOSITION OF BUFFER LAYERS ON TEXTURED METAL SURFACES

FIELD OF THE INVENTION

The invention generally relates to multilayer articles and methods of making such articles, and in particular, relates to multilayer articles containing epitaxially grown layers. The invention more particularly relates to the growth of an epitaxial metal oxide buffer layer(s) on metal substrates.

BACKGROUND OF THE INVENTION

Multi-layer articles can be used in a variety of applications. Biaxially textured metal oxide buffer layers on metal substrates are potentially useful in electrical and/or electronic devices where an electrically active layer is deposited on the buffer layer. The electrically active layer may be a superconductor, a semiconductor, or a ferroelectric material. Typically, such articles 10 include a metal substrate 11, buffer layer(s) 12, and an active layer 13, e.g., a superconductor, as illustrated in FIG. 1. The metal substrate, such as Ni, Ag, or Ni alloys, provides flexibility for the article and can be fabricated over long lengths and large areas. Metal oxide layers, such as $LaAlO_3$, $CeO_2$, or yttria-stabilized zirconia (YSZ), make up the next layer and serve as chemical barriers between the metal substrate and the active layer. The buffer layer(s) can be more resistant to oxidation than the substrate and can reduce the diffusion of chemical species between the substrate and the superconductor layer. Moreover, the buffer layer(s) can have a coefficient of thermal expansion that is well matched with the superconductor material.

To achieve high critical current densities in the article, the superconducting material is biaxially textured and strongly linked. As used herein, "biaxially textured" refers to a surface for which the crystal grains are in close alignment with a direction in the plane of the surface and a direction perpendicular to the surface. One type of biaxially textured surface is a cube textured surface, in which the crystal grains are also in close alignment with a direction perpendicular to the surface. Examples of cube textured surfaces include the (100)[001] and (100)[011] surfaces, and an example of a biaxially textured surface is the (113)[211] surface.

Typically, the buffer layer is an epitaxial layer, that is, its crystallographic orientation is directly related to the crystallographic orientation of the surface onto which the buffer layer is deposited. For example, in a multi-layer superconductor having a substrate, an epitaxial buffer layer and an epitaxial layer of superconductor material, the crystallographic orientation of the surface of the buffer layer is directly related to the crystallographic orientation of the surface of the substrate, and the crystallographic orientation of the layer of superconductor material is directly related to the crystallographic orientation of the surface of the buffer layer. Therefore, the superconducting properties exhibited by a multi-layer superconductor having a buffer layer can depend upon the crystallographic orientation of the buffer layer surface.

The conventional processes used to grow buffer layers on metal substrates and achieve this transfer of texture include vacuum processes such as pulsed laser deposition, sputtering, and electron beam evaporation. Such techniques are disclosed in, for example, A. Goyal, et al., "Materials Research Society Spring Meeting, San Francisco, Calif., 1996; X. D. Wu, et al., Appl. Phys. Lett. 67:2397, 1995). Solution phase techniques, including metalorganic deposition (MOD), are also used to grow buffer layers. Such techniques are disclosed in, for example, S. S. Shoup et al., J. Am. Cer. Soc., Vol. 81, 3019; D. Beach et al., Mat. Res. Soc. Symp. Proc., vol. 495, 263 (1988); M. Paranthaman et al., Superconductor Sci. Tech., vol. 12, 319 (1999); D. J. Lee et al., Japanese J. Appl. Phys., vol. 38, L178 (1999) and M. W. Rupich et al., I.E.E.E. Trans. on Appl. Supercon. vol. 9, 1527 (1999).

When using solution phase techniques to deposit epitaxial oxide films on oxidizable metal or metal alloy substrates, it is necessary to carry out the process in a reducing atmosphere relative to the oxidation potential of the metal or metal alloy of the substrate. This is illustrated in FIG. 3, which shows the metal/metal oxide phase stability line for Ni and W as a function of temperature and oxygen pressure. Typically for substrates such as nickel or NiW alloys, a hydrogen/argon environment is employed, e.g., 4%/96% H/Ar. See, U.S. Pat. No. 6,077,344. The use of the reducing environment typically requires higher temperatures, e.g., of about 1000–1200° C., to completely decompose the organic components of the precursor film and to nucleate and crystallize the oxide phase. Although these conditions produce oxide films with epitaxial texture, the high temperatures frequently result in undesirable grain growth and roughening of the oxide film surface. The surface roughness increases as the thickness of the oxide layer increases. Also the high processing temperatures increase the rate of metal diffusion through the buffer layer causing potential contamination of the buffer and subsequent layers.

Under oxidizing conditions, it may be possible to directly deposit a textured oxide buffer layer on a metal substrate, particularly if the metal is not overly sensitive to oxidation, e.g., nickel. See, for example, U.S. Pat. No. 6,440,211. Direct growth of epitaxial buffer layers on a metal substrate under even mildly oxidizing conditions has not been successful to date, however, because the metal surface inevitably forms a metal oxide layer which may have a crystal structure different than the underlying metal and which disrupts epitaxial growth.

SUMMARY OF THE INVENTION

In one aspect of the present invention, a process is provided by which epitaxial layers are grown on metal substrates using a solution based technique under conditions that reduce the potential for substrate metal oxidation, avoid grain growth and surface roughening, and provide a smooth surface morphology of the deposited layer. The process also can provide solution-grown epitaxial layers with low surface roughness at thicknesses of up to 300 nm.

One approach for achieving these and other desirable features is to first deposit a textured seed layer on a metal surface under a reducing atmosphere. A subsequent layer(s) is deposited over the seed layer from a solution-based precursor in a moist, oxidizing environment. The seed layer serves as an oxygen diffusion barrier to prevent oxidation of the underlying metallic surface upon exposure to the more oxidizing environment in the subsequent deposition steps. The oxidizing environment promotes decomposition of the organic components of the solution-based precursor and nucleation of the oxide crystals at low temperatures and conditions the surface of the epitaxially grown film to provide an epitaxial film with a fine-grained, smooth surface. The low temperature, oxidizing environment also provides a "thick," e.g., up to about 300 nm, epitaxial metal oxide layer.

In one or more embodiments of the present invention, a multilayer article is prepared by depositing a first material on the surface of a metal substrate to form a biaxially textured seed layer of the first material, the first material being deposited under reducing conditions relative to the metal substrate; and thereafter epitaxially depositing a second material over the seed layer, wherein the second material is deposited from a solution-based precursor under moist oxidizing conditions that are more oxidizing than the reducing conditions used in the deposition of the first material, and wherein the atmosphere of the oxidizing conditions comprises a water partial pressure in the range of about 4 torr to about 40 torr, or about 4 to 25 torr, or about 10 to 25 torr.

By "biaxially textured" as used herein it is meant that a surface of a layer has crystal grains in close alignment with a direction in the plane of the surface and a direction perpendicular to the surface. By "epitaxially depositing" as used herein it is meant that the deposited layer has a crystallographic orientation that is directly related to the crystallographic orientation of the surface onto which the layer is deposited.

In one or more embodiments of the present invention, the second material is deposited under moist, oxidizing conditions that include heating in an oxygen-containing atmosphere having an oxygen partial pressure of at least $10^{-21}$ atm or in some embodiments, about $10^{-21-10-12}$ atm oxygen. In one or more embodiments of the present invention, oxidizing conditions are controlled by controlling the relative partial pressures of hydrogen and water. The ratio of water partial pressure to hydrogen partial pressure in one or more embodiments is in the range of about 0.1 to about 1. The second material is deposited as a layer at a thickness of at least 5 nm to up to about 300 nm. The layer possesses a smooth surface morphology and is suitable for deposition of additional layers such as a superconductor oxide layer thereon.

In one or more embodiments of the present invention, the first material also is deposited using a solution-based precursor, and the seed layer is grown from the precursor under a reducing atmosphere. In one or more embodiments, the reducing atmosphere has low oxygen partial pressures, i.e., less than about $10^{-15}$, and in some embodiments about $10^{-15-10-21}$ atm oxygen. In one or more embodiments, oxygen partial pressure is controlled by controlling the relative amounts of hydrogen partial pressure and, optionally, water partial pressure of the reducing conditions. The ratio of water partial pressure to hydrogen partial pressure in one or more embodiments is in a range of about 0.01 to about 0.5, or less than about 0.1.

In one or more embodiments of the present invention, the first material is deposited using a vacuum or low pressure deposition technique in a reducing environment.

One or more layers optionally are deposited onto the substrate according to one or more embodiments of the invention. Layers may be deposited between the first material (seed) layer and the second material layer. Layers also may be deposited after the second layer. Additional layers may be processed using the moist oxidizing conditions of the present invention, or using conventional vacuum or low pressure deposition techniques.

BRIEF DESCRIPTION OF THE DRAWING

The present invention is described with reference to the following drawings, which are presented for the purpose of illustration only and are not intended to be limiting of the invention.

DESCRIPTION OF THE INVENTION

Figure 1:
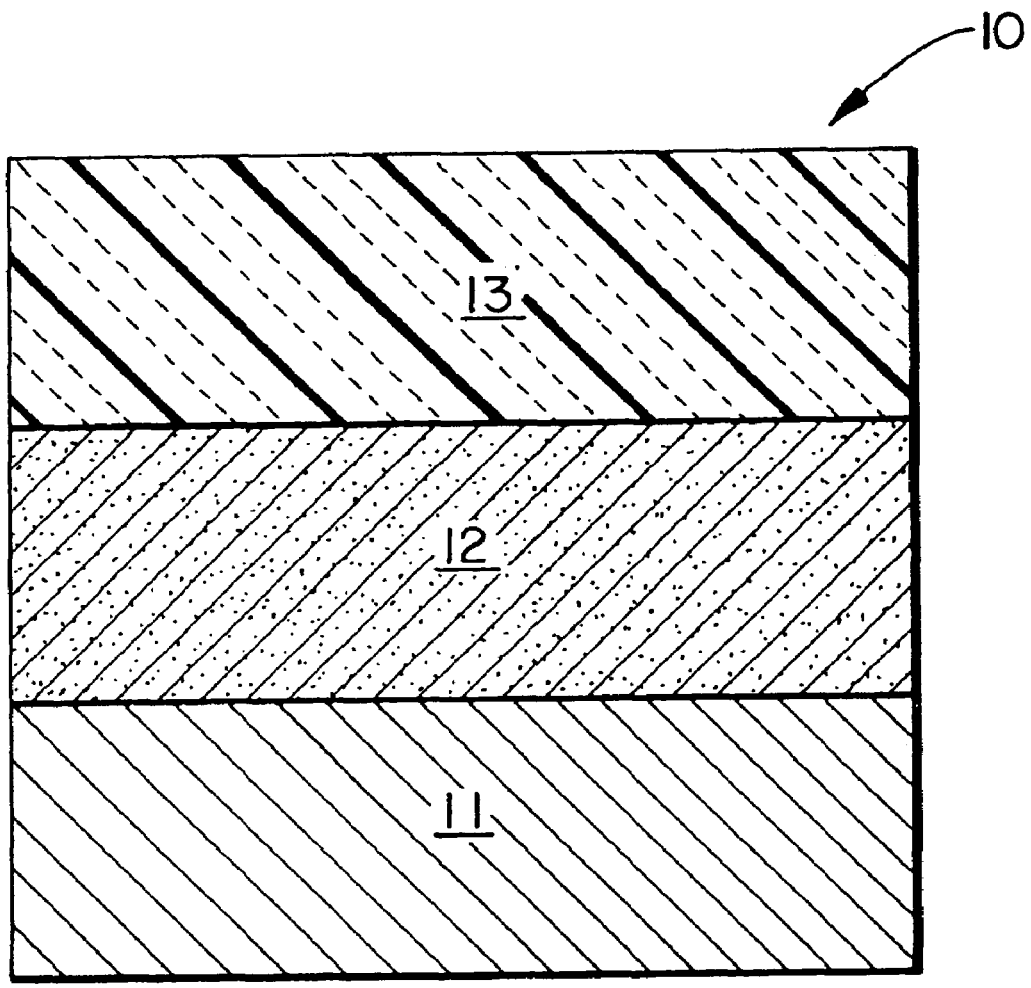
FIG. 1 is a cross-sectional view of a typical superconductor article.
Figure 2:
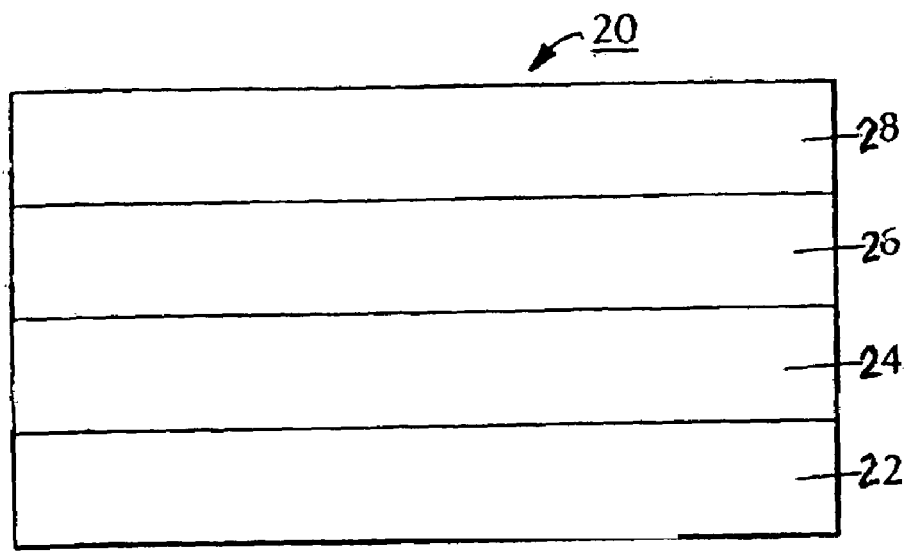
FIG. 2 is a cross-sectional view of a superconductor article according to one or more embodiments of the present invention.

The invention relates to a multilayer article 20, such as a superconducting article, and methods of making it. The articles and methods of one or more embodiments of the present invention are described with reference to FIG. 2.

The method involves first depositing a biaxially textured seed layer 24 on a metal substrate 22 surface under reducing conditions, and thereafter epitaxially depositing a subsequent layer(s) 26 onto the seed layer in a humid oxidizing environment. One or more additional layers 28, such as a superconductor material, a precursor to a superconductor material, a cap material, e.g., a buffer layer on which a superconductor material is formed, or further buffer material can be deposited onto the layer 26. Additional layers may also be deposited between layers 24 and 26. In one or more embodiments layer 26 is a barrier layer, i.e., a layer that acts to substantially reduce diffusion of constituents from the substrate into the superconductor material. In one or more embodiments layer 26 is a cap layer; i.e., a layer on which an active layer such as a superconductor material is deposited. In some embodiments, a multilayer superconductor article contains a seed layer, a barrier layer and a cap layer, in which either the barrier layer, the cap layer or both are deposited in a humid oxidizing environment according to one or more embodiments of the present invention.

Substrates

Metal substrate 22 can be formed of any material capable of supporting a biaxially textured seed layer 24. Examples of suitable substrate materials include metals such as nickel, silver, copper, zinc, aluminum, iron, chromium, vanadium, palladium, molybdenum and their alloys. In some embodiments, substrate 22 can be a superalloy. In certain embodiments, substrate 22 can be in the form of an object having a relatively large surface area (e.g., a tape or a wafer). In these embodiments, substrate 22 is preferably formed of a relatively flexible material.

In some embodiments, the substrate is a binary alloy that contains two of the following metals: copper, nickel, chromium, vanadium, aluminum, silver, iron, palladium, molybdenum, tungsten, gold and zinc. For example, a binary alloy can be formed of nickel and chromium (e.g., nickel and at most 20 atomic percent chromium, nickel and from about five to about 18 atomic percent chromium, or nickel and from about 10 to about 15 atomic percent chromium). As another example, a binary alloy can be formed of nickel and copper (e.g., copper and from about five to about 45 atomic percent nickel, copper and from about 10 to about 40 atomic percent nickel, or copper and from about 25 to about 35 atomic percent nickel). As a further example, a binary alloy can contain nickel and tungsten (e.g., from about one atomic percent tungsten to about 20 atomic percent tungsten, from about two atomic percent tungsten to about 10 atomic percent tungsten, from about three atomic percent tungsten to about seven atomic percent tungsten, about five atomic percent tungsten). In certain embodiments, the substrate contains more than two of the above-listed metals (e.g., a ternary alloy or a quaternary alloy).

In some embodiments, the alloy can contain one or more oxide formers (e.g., Mg, Al, Ti, Cr, Ga, Ge, Zr, Hf, Y, Si, Pr, Eu, Gd, Th, Dy, Ho, Lu, Th, Er, Tm, Be, Ce, Nd, Sm, Yb and/or La, with Al being the preferred oxide former), as well as two of the following metals: copper, nickel, chromium, vanadium, aluminum, silver, iron, palladium, molybdenum, gold and zinc. The alloys can contain at least about 0.5 atomic percent oxide former (e.g., at least about one atomic percent oxide former, or at least about two atomic percent oxide former) and at most about 25 atomic percent oxide former (e.g., at most about 10 atomic percent oxide former, or at most about four atomic percent oxide former).

The above-described alloys and compositions can include relatively small amounts of additional metals (e.g., less than about 0.1 atomic percent of additional metals, less than about 0.01 atomic percent of additional metals, or less than about 0.005 atomic percent of additional metals).

The alloy substrate can be produced by, for example, combining the constituents in powder form, melting and cooling or, for example, by diffusing the powder constituents together in solid state. The substrate can then be deformation processed (e.g., by annealing and rolling, swaging, extrusion and/or drawing) to form a textured surface (e.g., biaxially textured or cube textured). Alternatively, the alloy constituents can be stacked in a jelly roll configuration, and then deformation textured. In some embodiments, a material with a relatively low coefficient of thermal expansion (e.g., Nb, Mo, Ta, V, Cr, Zr, Pd, Sb, NbTi, an intermetallic such as NiAl or $Ni_3Al$, or mixtures thereof) can be formed into a rod and embedded into the alloy prior to deformation texturing.

Preferably, the surface of substrate 22 has a relatively well defined crystallographic orientation. For example, the surface of substrate 22 can be a biaxially textured surface (e.g., a (113)[211] surface) or a cube textured surface (e.g., a (100)[011] surface or a (100)[001]surface). Preferably, the peaks in an X-ray diffraction pole figure of surface have a FWHM of less than about 20° (e.g., less than about 15°, less than about 10°, or from about 5° to about 10°).

The surface of substrate 22 can also be prepared using vacuum processes, such as ion beam assisted deposition, inclined substrate deposition and other vacuum techniques known in the art to form a biaxially textured surface on, for example, a randomly oriented polycrystalline surface. In certain embodiments (e.g., when ion beam assisted deposition is used), surface of substrate 22 need not be textured (e.g., the surface can be randomly oriented polycrystalline, or the surface can be amorphous).

In some instances, the metal substrate includes an intermediate metal or alloy layer, typically prepared using a metal that is more stable to oxidation than the underlying metal substrate. Metals suitable for use in the present invention also include those epitaxial metal or alloy layers that do not form surface oxides when exposed to $P_{O2}$ and temperature conditions required during subsequent growth of epitaxial buffer layers. Exemplary intermediate metal layers include nickel, gold, silver, palladium, and alloys thereof.

In some of these embodiments, the intermediate metal seed layer is transient in nature. "Transient," as used herein, refers to an intermediate layer that is wholly or partly incorporated into or with the biaxially textured substrate following the initial nucleation and growth of the epitaxial film. Even under these circumstances, the intermediate layer and biaxially textured substrate remain distinct until the epitaxial nature of the deposited film has been established. Care should be taken that the deposited intermediate metal layer is not completely incorporated into or does not completely diffuse into the substrate before nucleation and growth of the initial buffer layer structure causes the epitaxial layer to be established. This means that after selecting the metal (or alloy) for proper attributes such as diffusion constant in the substrate alloy, thermodynamic stability against oxidation under practical epitaxial growth conditions and lattice matching with the epitaxial layer, the thickness of the deposited metal layer is adapted to the epitaxial layer deposition conditions, in particular to temperature. Deposition of the intermediate metal layer can be accomplished using a vacuum process such as evaporation or sputtering, or by electrochemical means such as electroplating (with or without electrodes). These deposited intermediate metal layers may or may not be epitaxial after deposition (depending on substrate temperature during deposition), but epitaxial orientation can subsequently be obtained during a post-deposition heat treatment.

In certain embodiments, sulfur can be formed on the surface of the metal layer. The sulfur can be formed on the surface of the metal layer, for example, by exposing the intermediate layer to a gas environment containing a source of sulfur (e.g., $H_2S$, a tantalum foil or a silver foil) and hydrogen (e.g., hydrogen, or a mix of hydrogen and an inert gas, such as a 5% hydrogen/argon gas mixture). This can be performed at elevated temperature (e.g., at a temperature of from about 450° C. to about 1100° C., from about 600° C. to about 900° C., or at about 850° C.). The pressure of the hydrogen (or hydrogen/inert gas mixture) can be relatively low (e.g., less than about one torr, less than about $1 \times 10^{-3}$ torr, less than about $1 \times 10^{-6}$ torr) or relatively high (e.g., greater than about 1 torr, greater than about 100 torr, greater than about 760 torr).

Without wishing to be bound by theory, it is believed that exposing the textured substrate surface to a source of sulfur under these conditions can result in the formation of a superstructure (e.g., a c(2×2) superstructure) of sulfur on the textured substrate surface. It is further believed that the superstructure can be effective in stabilizing (e.g., chemically and/or physically stabilizing) the surface of the metal layer. Moreover, it is believed that other superstructures may also be effective in stabilizing (e.g., chemically and/or physically stabilizing) the surface. For example, it is believed that an oxygen superstructure, a nitrogen superstructure, a carbon superstructure, a potassium superstructure, a cesium superstructure, a lithium superstructure or a selenium superstructure disposed on the surface may be effective in enhancing the stability of the surface.

The oxygen sensitivity of the metal substrate will vary, and the growth conditions of the subsequently deposited layers are adapted to reflect the relative oxygen-sensitivity of the metal substrate. For example, thicker seed layers and/or less oxidizing conditions are employed in subsequent processing steps to avoid undesirable oxidation of the metal substrate.

Seed Layer

In one or more embodiments of the present invention, a seed layer 24 is formed on the surface of substrate 22. The role of the seed layer is to provide a crystalline, biaxially textured surface for the nucleation and growth of additional epitaxially deposited layers and to inhibit the oxidation of the substrate during deposition of the additional layers when carried out in an oxidizing atmosphere relative to the substrate. The seed layer may also provide an epitaxial template for growth of subsequent oxide layers. In order to accomplish these goals, the biaxially textured seed layer should grow over the entire surface of the metal substrate and be free of any contaminants that may interfere with the deposition of subsequent epitaxial buffer layers.

The thickness of the deposited seed layer is adapted to the subsequent oxide layer deposition conditions, in particular to temperature and oxygen partial pressure. The seed layer is not required to be thick, although it should be sufficiently thick to inhibit or slow down oxygen diffusion during deposition of subsequent oxide layers. In one or more embodiments of the present invention, the seed layer has a thickness of greater than about 20 nm. In other embodiments, the seed layer has a thickness of about 25–200 nm, or about 50–80 nm.

The seed layer also is selected for proper attributes such as diffusion constant in the substrate alloy, thermodynamic stability against oxidation under practical epitaxial oxide layer growth conditions and lattice matching with the subsequently deposited epitaxial oxide layer(s). Examples of materials suitable for use as a seed layer include metals having a cubic symmetry, and metal oxides and metal nitrides that have a good lattice match for the substrate. Exemplary materials include silver, gold, palladium, nickel, $CeO_2$, $Y_2O_3$, $TbO_x$, $GaO_x$, yttria-stabilized zirconium (YSZ), $LaAlO_3$, $SrTiO_3$, $Gd_2O_3$, $LaNiO_3$, $LaCuO_3$, $NdGaO_3$, $NdAlO_3$, MgO, $CaF_2$, AlN, NbN, TiN, VN, YN, ZrN, NiO, $Al_2O_3$, $SmBa_2Cu_3O_x$, $MgF_2$, $LaMnO_3$, $La_{0.66}Ca_{0.33}MnO_3$, $La_{0.66}Sr_{0.33}MnO_3$, $La_{0.66}Ba_{0.33}Mn_3$, $La_2Zr_2O_7$, $Gd_2Zr_2O_7$, $Ba_2Zr_2O_7$ and doped compounds thereof and/or nitrides as known to those skilled in the art.

The seed layer can be deposited using any known deposition technique, including low pressure deposition techniques such as sputtering and physical vapor deposition (PVD), electron beam and thermal evaporation, pulsed laser deposition (PLD), and metal organic chemical vapor deposition (MOCVD). Solution coating processes can also be used for deposition of the seed layer onto the substrate. Solution deposition is typically carried out at or near atmospheric pressures.

Figure 3:
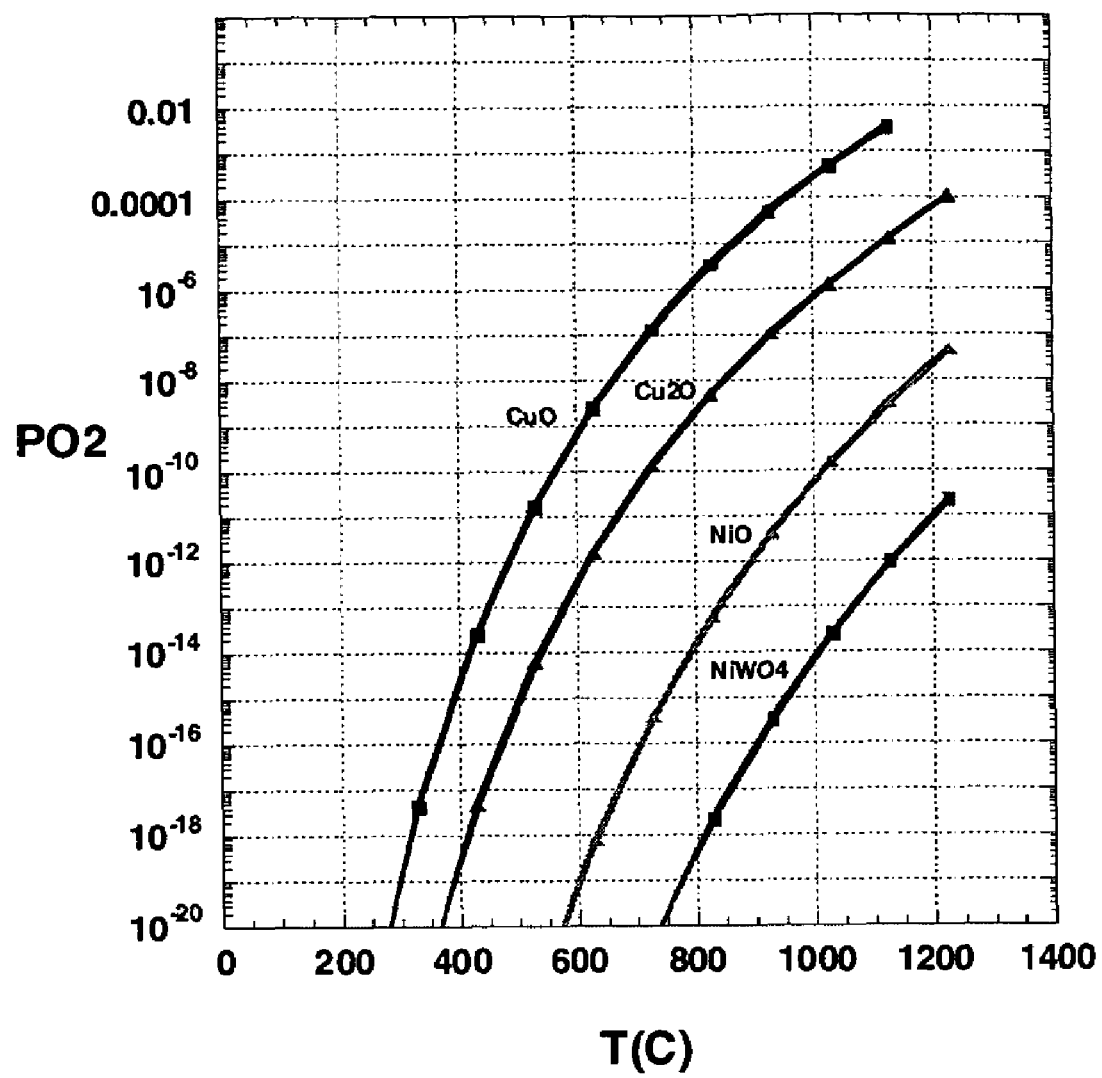
FIG. 3 is a plot of the stability line for various metal/metal oxides as a function of oxygen pressure and temperature.

The seed layer is deposited under reducing conditions. As used herein "reducing conditions" relative to the metal substrate refers to processing conditions at which the oxygen partial pressure during deposition is less than that needed to form a stable oxide of one or more metals of the metal substrate. The appropriate conditions are known in the art and may vary depending on the metal/metal oxide system under consideration. FIG. 3 provides phase stability lines for various metals and their metal oxides as a function of oxygen partial pressure and temperature. The metal is stable at oxygen partial pressures and temperatures that are below the curve indicated for the respective metal oxides. Thus, reducing conditions can be determined for each metal/metal oxide system.

The reducing conditions may include a hydrogen partial pressure. Exemplary reducing atmospheres include 4% v/v hydrogen in argon, helium, or nitrogen being a suitable gas composition. Mixtures of 2–6% v/v hydrogen are commonly referred to as "forming gas" and are not generally combustible under most conditions. Carbon monoxide/carbon dioxide mixtures are also commonly used as gaseous reducing agents. The total oxygen partial pressure is desirably maintained below $10^{-15}$, and in some embodiments is in the range of about $10^{-15}$ to about $10^{-21}$ atm. In other exemplary embodiments, the partial pressure of oxygen is maintained at low levels using a mixture of hydrogen gas and water vapor. The ratio of the two is selected to maintain the reducing environment needed for the deposition of the seed layer without oxidation of the metal substrate. The appropriate ratio of water partial pressure ($P_{H2O}$) to hydrogen partial pressure ($P_{H2}$) or oxygen partial pressure ($P_{O2}$) will vary for each metal/metal oxide system.

Figure 4:
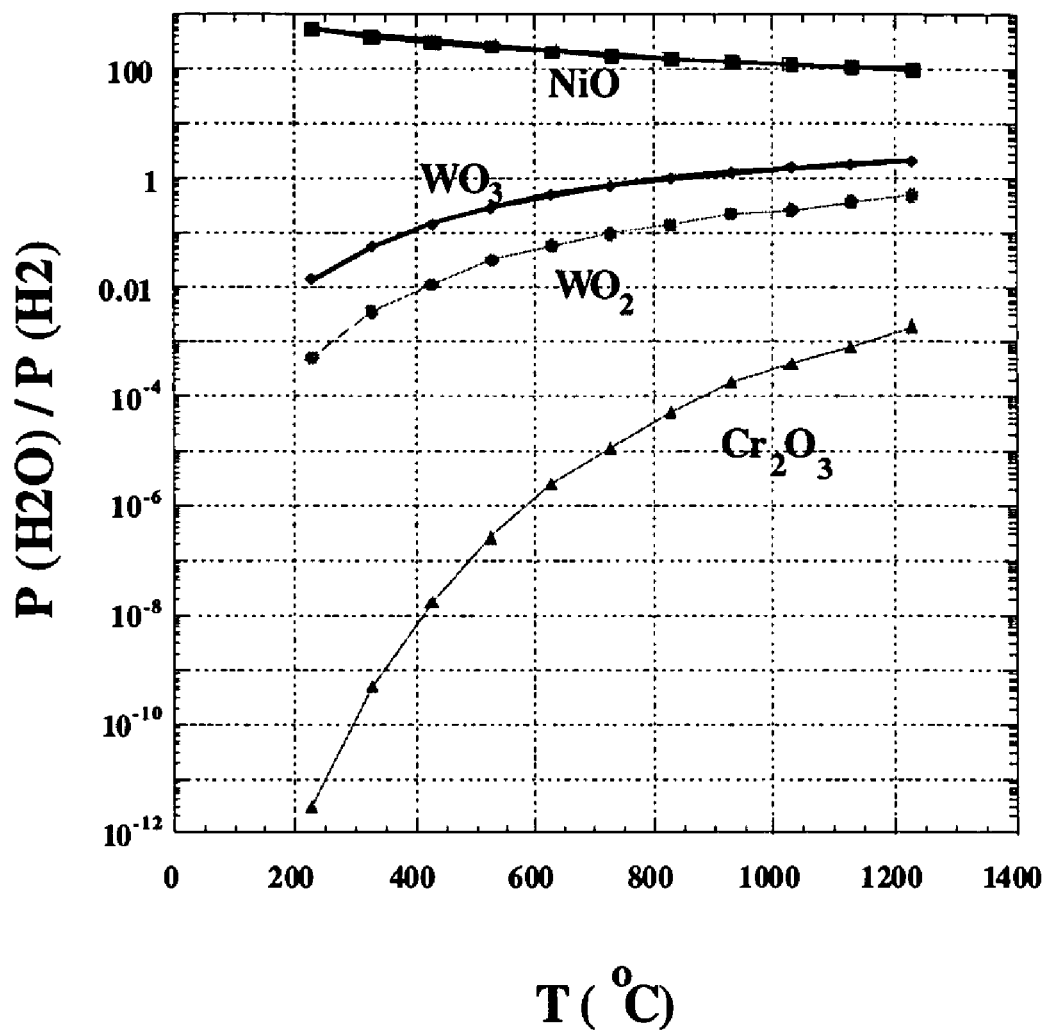
FIG. 4 is a plot of the stability line for various metal/metal oxides as a function of the ratio of water partial pressure to hydrogen partial pressure and temperature.

FIG. 4 provides phase stability lines for several metals (and their oxides) that are typically used as substrates in the multilayer articles of the present invention. The more stable the metal to oxidation, the higher the curve and the greater the permissible amount of water in the deposition atmosphere. In one or more embodiments using a tungsten containing substrate, the ratio of water partial pressure to hydrogen partial pressure is in the range of about 0.01 to about 0.5, or less than about 0.1, at temperatures between about 400° C. to about 1100° C. An inert gas can also be included in the processing atmosphere.

As noted above, the seed layer may be deposited using a solution-based deposition technique. As used herein, "solution-based deposition" refers to a technique that deposits a precursor of a target material from a liquid medium in which the precursor is dissolved, suspended or slurried. The precursor is then treated under suitable conditions, e.g., suitable temperatures and atmospheres, to obtain the target material. Various methods may be used in preparing a seed layer using a solution-based deposition process according to one or more embodiments of the present invention.

Suitable solution preparation techniques include sol-gel processes that use metal alkoxide complexes in alcohol solution, or metal-organic decomposition (MOD) techniques that use metal organic precursors in an organic solvent, water, or an aqueous solution. In one or more embodiments of the present invention, the precursor solution uses alkoxide, carboxylate, or nitrate compounds of the appropriate metals. The coating solution can be prepared using these solutions or any other coating solution capable of being coated on a metal substrate and subsequently capable of forming a metal or a metal oxide or a metal nitride on the substrate.

Any method of applying the coating solution to the metal substrate is acceptable for use with this invention. Exemplary methods of applying the coating solution to the metal substrate include spin coating, dip coating, slot die coating, gravuere coating and ink jet coating. For any of the methods, the metal substrate can be coated in a controlled atmosphere or in air. Spin coating involves spinning the metal substrate at high revolutions per minute (RPM), for example approximately 2,000 RPM, and applying the solution onto the metal substrate. Any spinner capable of applying a coating solution to the metal substrate is acceptable for use with this invention. Slot die coating involves applying a liquid to a substrate, in which the liquid is forced from a reservoir through a slot by pressure, and is transferred to a moving substrate. So long as coating solution is applied to the metal substrate with the desired thickness and uniformity, the invention is not limited as to any particular coating process.

The coating solution is heated under reducing conditions to decompose the precursor, thereby leaving the corresponding metal oxide (or metal or metal nitride) remaining on the metal substrate. The reducing atmosphere also prevents any oxidation of the surface of the metal substrate. The article is heated for a combination of time and temperature sufficient to decompose the organic components of the precursor solution and to leave the desired crystal structure of the metal, metal oxide or metal nitride. Any time, temperature and atmosphere combination that accomplishes these goals is acceptable for use with the invention. See, for example, FIGS. 3 and 4 for guidance in selecting the appropriate reducing conditions according to one or more embodiments of the present invention. According to one or more embodiments of the present invention, temperatures can range from about 800° C. to about 1200° C., or from about 1000° C. to about 1100° C. under an oxygen partial pressure of less than about $10^{-15}$ atm, or less than about $10^{-16}$ atm, or less than about $10^{-17}$ atm, or less than about $10^{-18}$ atm, or less than about $10^{-19}$ atm, or less than about $10^{-20}$ atm, or less than about $10^{-21}$ atm.

In some embodiments, a biaxially textured seed layer 24 can be formed on an amorphous substrate using ion beam assisted deposition (IBAD). In this technique, a seed layer material is evaporated using, for example, electron beam evaporation, sputtering deposition, or pulsed laser deposition while an ion beam (e.g., an argon ion beam) is directed at a smooth amorphous surface of a substrate onto which the evaporated seed layer material is deposited. For example, the seed layer can be formed by ion beam assisted deposition by evaporating a seed layer material having a rock-salt like structure (e.g., a material having a rock salt structure, such as an oxide, including MgO, or a nitride) onto a smooth, amorphous surface (e.g., a surface having a root mean square roughness of less than about 100 Angstroms) of a substrate so that the seed layer material has a surface with substantial alignment (e.g., about 13° or less), both in-plane and out-of-plane.

The conditions used during IBAD deposition of the seed layer material can include, for example, a substrate temperature of from about 0° C. to about 750° C. (e.g., from about 0° C. to about 400° C., from about room temperature to about 750° C., from about room temperature to about 400° C.), a deposition rate of from about 1.0 Angstrom per second to about 4.4 Angstroms per second, an ion energy of from about 200 eV to about 1200 eV, and/or an ion flux of from about 110 microamperes per square centimeter to about 120 microamperes per square centimeter.

These methods are described in PCT Publication No. WO 99/25908, published on May 27, 1999, and entitled "Thin Films Having A Rock-Salt-Like Structure Deposited on Amorphous Surfaces," which is hereby incorporated by reference.

Second Layer

After the seed layer is deposited at a thickness sufficient to inhibit oxidation of the metal substrate and to provide a stable crystalline surface, a second layer 26 of the same or different material can be deposited under more oxidizing conditions using a solutions-based precursor. The second layer may be deposited directly onto the seed layer, or it may be deposited onto intermediate layers that have been deposited onto the seed layer. The second layer is typically an oxide buffer layer, or an oxide cap layer onto which an active layer is deposited.

The solution-based precursor provides a simple and rapid method of depositing relatively thick films, e.g., up to about 300 nm, or about 5 nm to about 300 nm, or about 25 nm to about 300 nm, or about 50 nm to 300 nm, or about 100 nm to about 300 nm; and the moist, oxidizing conditions permit the rapid formation of dense, epitaxial metal oxide layers at lower temperatures and with a smooth surface. As used herein, a "smooth surface" refers to a surface of the buffer layer that is relatively atomically flat. In one or more embodiments, the surface roughness of the deposited layer is less than 10 nm rms, or about 1 to about 10 nm rms. The surface may also contain a high number of termination planes that are oriented in a desirable direction. "Termination plane" of a layer refers to the plane of the layer that forms an interface with another layer that is formed thereon.

In one or more embodiments, the second oxide layer has a termination plane with a relatively high degree of orientation in a desirable direction (e.g., (001) or (111)). At least about 25% (e.g., at least about 30%, at least about 40%, at least about 50%, at least about 60%, at least about 70%, at least about 80%, at least about 90%, at least about 95%) of the termination plane of the layer of the second oxide material is oriented in a desirable direction, e.g., the (001) plane or the (111) plane. In one or more embodiments, a ratio of the amount of the termination plane of the layer of the second material that is the (111) plane to the amount of the termination plane of the second material that is the (001) plane is less than about one (e.g., less than about 0.75, less than about 0.5, less than about 0.4, less than about 0.3, less than about 0.2, less than about 0.1).

In one or more embodiments, the buffer layer is ceria ($CeO_2$) and the termination plane is oriented in the (001) direction. The termination plane of the ceria buffer layer can have at least one (001) plateau with an area of about 500 nm$^2$ (as measured by atomic force microscopy) and can be parallel to the termination plane of the substrate to within about 5 degrees.

Examples of materials suitable for use as a second layer include metal oxides that have a good lattice match for the substrate and the seed layer. Exemplary materials include $CeO_2$, $Y_2O_3$, $TbO_x$, $GaO_x$, YSZ, $LaAlO_3$, $SrTiO_3$, $Gd_2O_3$, $LaNiO_3$, $LaCuO_3$, $NdGaO_3$, $NdAlO_3$, MgO, NiO, Ag, $Al_2O_3$, $SmBa_2Cu_3O_x$, $MgF_2$, $LaMnO_3$, $La_{0.66}Ca_{0.33}MnO_3$, $La_{0.66}Sr_{0.33}MnO_3$, $La_{0.66}Ba_{0.33}Mn_3O_3$, $La_2Zr_2O_7$, $Gd_2Zr_2O_7$, $Ba_2Zr_2O_7$, $Y_2Ce_2O_7$ and doped compounds thereof as known to those skilled in the art.

The second layer is prepared using solution deposition techniques, including metalorganic deposition and/or sol-gel deposition, which are known to those skilled in the art. The precursor solution can be any metal source that is soluble in the organic or aqueous solution used to prepare the precursor solution. In one or more embodiments of the present invention, the precursor solution uses metal alkoxides or acetate or nitrate salts, metal oxides, metal hydroxides, metal halides metal acetylacetonates, metal carbonates, metal carboxylates or metal oxalates of the appropriate metals. The solvent or combination of solvents used in the precursor solution can include any solvent or combination of solvents capable of dissolving the metal salts. Such solvents include, for example, alcohols, including methanol, ethanol, isopropanol and butanol, and water.

In one or more embodiments, the precursor solution is prepared using metal acetates. Metal acetates are inexpensive, readily available and/or easy to prepare, however, many of the metal acetates have limited solubility in the precursor solvents. It has been discovered that the solubility of metal acetates can be improved by reducing or eliminating the waters of hydration in the starting material and/or by complexing the metals with higher molecular weight acid ligands, such as propionic acid. These acetate-derived precursor solutions are suitable for producing epitaxial oxide films on textured surfaces. These methods and solutions are described in U.S. Published patent application No. 2002/0056401.

The second material is deposited from the precursor solution, which can be made and applied as described herein above. For example, the precursor solution can be applied using spin coating, dip coating, slot die coating, gravuere coating, or ink jet coating, as described above for the seed layer.

If the precursor solution used to make the oxide layer does not adequately cover the underlying surface, then the resultant metal oxide layer will not provide the desired protection of the underlying layers from oxygen or chemical diffusion during subsequent deposition steps and will not provide a complete template for the epitaxial growth of subsequent layers. In one or more embodiments, the formation of the second layer is carried out so as to promote wetting of an underlying surface and to improve the coverage of the resultant metal oxide layer. The formation of metal oxide layers can be carried out using metal alkoxide precursors (for example, "sol gel" precursors), which are heated prior to decomposition. Substantially complete surface coverage is obtained by heating a sol gel film, and thereby allowing the precursor to flow into the substrate grain boundary areas. The heating can be relatively low temperature, for example, from about 80° C. to about 320° C., for example, from about 100° C. to about 300° C., or from about 100° C. to about 200° C. Such temperatures can be maintained from about 1 to about 60 minutes, for example, from about 2 to about 45 minutes, or from about 15 to about 45 minutes. The heating step can also be carried out using higher temperatures for a shorter time, for example, a film can be processed within two minutes at a temperature of 300° C. This heating step can be carried out after, or concurrently with, the drying of excess solvent from the sol gel film. It must be carried out prior to decomposition of the film, however.

According to one or more embodiments of the present invention, after coating the seed (or other underlying) layer with the metal salt solution, the layer can be air dried and then heated in an oxidizing decomposition step. During decomposition of the precursor coating and formation of the metal oxide layer, the environment is oxidizing relative to the reducing atmosphere used in the deposition of the seed layer. The article is heated for a combination of time and temperature sufficient to decompose the organic components of the precursor solution and to provide the desired crystal structure of the metal oxide. The nucleation step requires from about less than 1 minute to about 60 minutes, or 1 to 30 minutes, or 1 to 15 minutes, to take place under typical conditions; however, any time, temperature and atmosphere combination that accomplishes these goals is acceptable for use with the invention.

In one or more embodiments, the oxidizing environment includes an oxygen partial pressure greater than $10^{-21}$ atm, or in some embodiments in the range of $10^{-12}$ to $10^{-21}$ atm. Water vapor is used to provide the desired oxygen partial pressure. An inert gas may also be included in the deposition environment. Although not bound by any particular mode of operation, it is believed that the use of water vapor provides the ability to finely control the oxygen content in the processing environment. At elevated temperatures, the water vapor breaks down to provide atomic (or molecular) oxygen at a predictable level. The amount of water vapor used to provide a desired oxygen level is greater than the corresponding amount of oxygen gas needed to provide the same oxygen level, and is therefore easier to control.

Oxygen acts as a catalyst for decomposing the coating solution at lower temperatures. Thus, introduction of water or oxygen gas into the atmosphere advantageously allows for a lower processing temperature. Due to higher oxygen partial pressures, e.g., greater than $10^{-21}$ atm, or greater than about $10^{-20}$ atm, or greater than about $10^{-19}$ atm, or greater than about $10^{-18}$ atm, or greater than about $10^{-17}$ atm, or greater than about $10^{-16}$ atm, or greater than about $10^{-15}$ atm, or greater than about $10^{-14}$ atm, or greater than about $10^{-13}$ atm, or about $10^{-21}$ to about $10^{-12}$ atm, the organic components of the precursor solution can be decomposed at lower temperatures than under the reducing conditions used for the deposition of the seed layer. Typically, processing temperatures can be lowered by about 100° C. to about 200° C. In one or more embodiments, the second layer is heated at temperatures in the range of about 700° C. to about 1200° C. at oxygen partial pressures in the range of about $10^{-21}$ to $10^{-12}$ atm.

The oxygen partial pressure is a function of the temperature. The higher the processing temperature, the higher the oxygen partial pressure that can be used in both the first and second layer deposition. For a NiW substrate, the ranges for pO2 are somewhat temperature dependent, and can range as follows:

|  | $P_{O2}$ at 800° C. | $P_{O2}$ at 1100° C. |
| --- | --- | --- |
| First layer | $<10^{-21}$ atm | $<10^{-15}$ atm |
| Second layer | $10^{-21}$–$10^{-18}$ atm | $10^{-16}$–$10^{-12}$ atm |

Thus, oxidizing conditions can exist over a range of oxygen (and water) partial pressures, so long as the temperature is adjusted accordingly.

The ratio of hydrogen gas and water is used to control the oxygen content of the processing environment to form metal oxide layer. In one or more embodiments of the present invention, the ratio of the partial pressure of water to the partial pressure of hydrogen during deposition of the second material is in the range about 0.2 to about 1 at a temperature of about 800° C. to about 1100° C. The water partial pressure can be in the range of about 10–40 torr or about 10–25 torr, or about 4–25 torr. The second layer is heated in an oxidizing environment including a water partial pressure in the range of about 10 torr to about 40 torr and a hydrogen partial pressure in the range of about 20 torr to about 200 torr. The balance of the gas is an inert carrier gas such as nitrogen or argon in an amount to provide a total pressure in the range of about 30 torr to about 760 torr. In one or more embodiments, the second layer is formed at substantially atmospheric pressures.

Suitable conditions for the epitaxial deposition of the buffer layer is selected in consideration with the chemical composition of the underlying layers, in particular the seed layer, and the oxygen sensitivity of the metal substrate. Generally, the seed layer serves to slow down, but not eliminate, oxygen diffusion through the seed layer. Higher oxygen levels, while possibly desirable for optimal processing of the buffer layer, shorten the available processing time before undesirable oxidation of the underlying metal substrate (and possible concomitant loss of epitaxy and other undesirable processing consequences) occur. Thus, oxidizing conditions for deposition of the buffer layer are limited at the upper end. Under most circumstances, the oxygen partial pressure is less than about $10^{-12}$ atm. When using water vapor as the oxygen source, the partial pressure of water vapor is typically less than about 40 torr. In one or more embodiments, the partial pressure of water vapor is about 10–25 torr, or about 4–25 torr.

The high oxygen content permits the growth of high quality films (e.g., epitaxial growth, high density and smooth surface morphology) to much greater thicknesses than is possible under more reducing conditions. Under the reducing conditions described above, buffer layers having comparable film properties, e.g., rms of about 10 nm, cannot be obtained at thicknesses greater than about 20–30 nm. In comparison, oxide layers can be grown to thicknesses up to about 300 nm when using the moist, oxidizing conditions according to one or more embodiments of the present invention.

Additionally, in one or more embodiments of the present invention, the formation of metal oxide layers can be carried out under conditions at which the level of carbon contamination is greatly reduced over other known solution-based deposition processes. The carbon contamination accompanying conventional oxide film preparation in a reducing environment (e.g., 4% $H_2$—Ar) is believed to be the result of an incomplete removal of the organic components of the film. The presence of carbon-containing contaminants $C_xH_y$ and $C_aH_bO_c$ in or near the oxide layer can be detrimental, since they can alter the epitaxial deposition of subsequent oxide layers. Preferably, the carbon-containing contaminants are oxidized and removed from the film structure as $CO_2$ as the decomposition occurs. The deposition and growth of the buffer layer under moist oxidizing conditions provides the additional benefit of combusting the carbon contaminants of the precursor solution during film deposition and thereby reducing the carbon levels in the deposited layer.

Moreover, the high oxygen content of the oxidizing environment positively affects the surface morphology of the deposited film to provide a smooth surface. The use of water vapor in the oxidizing environment provides a surprising additional advantage of producing oxide films of smooth surface morphology, as has been described above. It is believed that the water vapor provides gas phase chemical species capable of affecting a change in the surface properties of the layer.

In one or more embodiments, the oxide layer has an atomically smooth surface with a surface roughness of about 10 nm rms or a range of about 2 nm to about 10 nm rms. In one or more embodiments, the oxide layer has a low incidence of termination planes (e.g., less than 50%, and typically less than about 40%, or about 30%, or about 20%, or about 10% or about 5%, or about 2%) other than the desired orientation. Exemplary desired orientations typically include (001), (010) and (100); however, surfaces having termination planes of other orientations, e.g., (111), (110), (211), (201) and (301), can be obtained.

Variations of the invention will be apparent to those of skill in the art and are contemplated as within the scope of the invention. For example, a coating deposited from solution can be initially heated in a decomposition step under an atmosphere that is reducing relative to the metal substrate to form a seed layer. Once the oxide layer nucleates on the metal substrate in the desired epitaxial orientation, the oxygen level of the processing gas is increased, for example, by adding water vapor or oxygen. Thus the seed layer and the second layer are prepared in a single, multi-stage heat treatment using the same precursor solution. This process is demonstrated in Example 5.

In one or more embodiments, various combinations of layer materials and/or layer thicknesses can be used. Some or all of these layers can be deposited using moist oxidizing conditions according to one or more embodiments of the present invention. By way of example only, a layer of $Y_2O_3$ or $CeO_2$ (e.g., from about 20 nanometers thick to about 50 nanometers thick) is deposited onto seed layer 24; a layer of YSZ (e.g., from about 0.1 micrometer thick to about 0.5 micrometer thick) is deposited on the $Y_2O_3$ or $CeO_2$ surface; and a $CeO_2$ layer (e.g., about 20 nanometers thick) is deposited onto the YSZ surface. One or more of these layers can be deposited using moist oxidizing conditions according to one or more embodiments of the present invention. Alternately, conventional deposition techniques, e.g., sputtering, IBAD, physical vapor deposition, chemical vapor deposition, and physical laser deposition, and the like, can be employed.

Additional Layers

Additional layers may be deposited on the second layer. For example, a superconductor oxide layer can be deposited. The superconductor may be a rare earth oxide superconductor material, such as yttrium barium copper oxide ("YBCO"). Various combinations of buffer layers and superconductor material layers can be used. For example, multiple buffer layers can be disposed between the substrate and the superconductor layer. As another example, multiple layers of superconductor material can be used. As an additional example, combinations of buffer layers and superconductor layers (e.g., alternating buffer layers and superconductor layers) can be used.

The well-aligned smooth surface of the oxide layer deposited under humid oxidizing conditions can be used as a substrate for the deposition of an oxide superconductor layer. Certain termination plane orientations, e.g., (001), have been associated with higher critical current density for subsequently deposited oxide superconducting films. $CeO_2$ has been demonstrated to form a high number of (001) planes when deposited according to one or more embodiments of the present invention. Thus a $CeO_2$ layer of high surface smoothness and well-aligned termination planes is deposited on an underlying substrate containing at least a metal substrate, e.g., NiW, and a seed layer, e.g., YSZ, according to one or more embodiments of the present invention. An oxide superconductor is deposited on the highly aligned termination planes of the $CeO_2$ layer using methods known to those of skill in the art. The resultant multilayer oxide superconductor article possesses improved critical current density.

Typically, solution chemistry is used to prepare barium fluoride and/or other superconductor precursors; and a solution (e.g., a solution containing metal salts, such as yttrium acetate, copper acetate, barium acetate and/or a fluorinated acetate salt of barium) is disposed on a surface (e.g., on a surface of a substrate, such as a substrate having an alloy layer with one or more buffer layers disposed thereon). The solution can be disposed on the surface using standard techniques (e.g., spin coating, dip coating, slot coating). The solution is dried to remove at least some of the organic compounds present in the solution (e.g., dried at about room temperature or under mild heat), and the resulting material is reacted (e.g., decomposed) in a furnace in a gas environment containing oxygen and water to form barium fluoride and/or other appropriate materials (e.g., CuO and/or $Y_2O_3$). In some embodiments, the reactors noted above can be used in any or all of these steps.

Examples of metal salt solutions that can be used are as follows.

In some embodiments, the metal salt solution can have a relatively small amount of free acid. In aqueous solutions, this can correspond to a metal salt solution with a relatively neutral pH (e.g., neither strongly acidic nor strongly basic). The metal salt solution can be used to prepare multi-layer superconductors using a wide variety of materials that can be used as the underlying layer on which the superconductor layer is formed.

The total free acid concentration of the metal salt solution can be less than about $1 \times 10^{-3}$ molar (e.g., less than about $1 \times 10^{-5}$ molar or about $1 \times 10^{-7}$ molar). Examples of free acids that can be contained in a metal salt solution include trifluoroacetic acid, acetic acid, nitric acid, sulfuric acid, acids of iodides, acids of bromides and acids of sulfates.

When the metal salt solution contains water, the precursor composition can have a pH of at least about 3 (e.g., at least about 5 or about 7).

In some embodiments, the metal salt solution can have a relatively low water content (e.g., less than about 50 volume percent water, less than about 35 volume percent water, less than about 25 volume percent water).

In embodiments in which the metal salt solution contains trifluoroacetate ion and an alkaline earth metal cation (e.g., barium), the total amount of trifluoroacetate ion can be selected so that the mole ratio of fluorine contained in the metal salt solution (e.g., in the form of trifluoroacetate) to the alkaline earth metal (e.g., barium ions) contained in the metal salt solution is at least about 2:1 (e.g., from about 2:1 to about 18.5:1, or from about 2:1 to about 10:1).

In general, the metal salt solution can be prepared by combining soluble compounds of a first metal (e.g., copper), a second metal (e.g., an alkaline earth metal), and a rare earth metal with one or more desired solvents and optionally water. As used herein, "soluble compounds" of the first, second and rare earth metals refer to compounds of these metals that are capable of dissolving in the solvent(s) contained in the metal salt solution. Such compounds include, for example, salts (e.g., nitrates, acetates, alkoxides, iodides, sulfates and trifluoroacetates), oxides and hydroxides of these metals.

In certain embodiments, a metal salt solution can be formed of an organic solution containing metal trifluoroacetates prepared from powders of $Ba(O_2CCH_3)_2$, $Y(O_2CCH_3)_3$, and $Cu(O_2CCH_3)_2$ which are combined and reacted using methods known to those skilled in the art. For example, the metal trifluoroacetate powders can be combined in a 2:1:3 ratio in methyl alcohol to produce a solution substantially 0.94 M based on copper content.

In certain embodiments, the metal salt solution can contain a Lewis base. The rare earth metal can be yttrium, lanthanum, europium, gadolinium, terbium, dysprosium, holmium, erbium, thulium, ytterbium, cerium, praseodymium, neodymium, promethium, samarium or lutetium. In general, the rare earth metal salt can be any rare earth metal salt that is soluble in the solvent(s) contained in the metal salt solution and that, when being processed to form an intermediate (e.g., a metal oxyhalide intermediate), forms rare earth oxide(s) (e.g., $Y_2O_3$). Such salts can have, for example, the formula $M(O_2C—(CH_2)_n—CXX'X")(O_2C—(CH_2)_m—CX'''X''''X''''')(O_2C—(CH_2)_p—CX''''''X'''''''X'''''''')$ or $M(OR)_3$. M is the rare earth metal n, m and p are each at least one but less than a number that renders the salt insoluble in the solvent(s) (e.g., from one to ten). Each of X, X', X", X''', X'''', X''''', X'''''' and X''''''' is H, F, Cl, Br or I. R is a carbon containing group, which can be halogenated (e.g., $CH_2CF_3$) or nonhalogenated. Examples of such salts include nonhalogenated carboxylates, halogenated acetates (e.g., trifluoroacetate, trichloroacetate, tribromoacetate, triiodoacetate), halogenated alkoxides, and nonhalogenated alkoxides. Examples of such nonhalogenated carboxylates include nonhalogenated actetates (e.g., $M(O_2C—CH_3)_3$). The alkaline earth metal can be barium, strontium or calcium. Generally, the alkaline earth metal salt can be any alkaline earth metal salt that is soluble in the solvent(s) contained in the metal salt solution and that, when being processed to form an intermediate (e.g., a metal oxyhalide intermediate), forms an alkaline earth halide compound (e.g., $BaF_2$, $BaCl_2$, $BaBr_2$, $BaI_2$) prior to forming alkaline earth oxide(s) (e.g., BaO). Such salts can have, for example, the formula $M'(O_2C—(CH_2)_n—CXX'X")(O_2C—(CH_2)_m—CX'''X''''X''''')$ or $M'(OR)_2$. M' is the alkaline earth metal. n and m are each at least one but less than a number that renders the salt insoluble in the solvent(s) (e.g., from one to ten). Each of X, X', X", X''', X'''' and X''''' is H, F, Cl, B or, I. R can be a halogenated or nonhalogenated carbon containing group. Examples of such salts include halogenated acetates (e.g., trifluoroacetate, trichloroacetate, tribromoacetate, triiodoacetate). Generally, the transition metal is copper. The transition metal salt should be soluble in the solvent(s) contained in the metal salt solution. Preferably, during conversion of the precursor to the intermediate (e.g., metal oxyhalide), minimal cross-linking occurs between discrete transition metal molecules (e.g., copper molecules). Such transition metals salts can have, for example, the formula $M"(CXX'X"—CO(CH)_aCO—CX'''X''''X''''')(CX''''''X'''''''X''''''''—CO(CH)_bCO CX'''''''''X''''''''''X'''''''''''),$ $M"(O_2C—(CH_2)_n—CXX'X")(O_2C—(CH_2)_m—CX'''X''''X''''')$ or $M"(OR)_2$. M" is the transition metal a and b are each at least one but less than a number that renders the salt insoluble in the solvent(s) (e.g., from one to five). Generally, n and m are each at least one but less than a number that renders the salt insoluble in the solvent(s) (e.g., from one to ten). Each of X, X', X", X''', X'''', X''''', X'''''', X''''''', X'''''''', X''''''''', X'''''''''', X''''''''''' is H, F, Cl, Br or I. R is a carbon containing group, which can be halogenated (e.g., $CH_2CF_3$) or nonhalogenated. These salts include, for example, nonhalogenated actetates (e.g., $M"(O_2C—CH_3)_2$), halogenated acetates, halogenated alkoxides, and nonhalogenated alkoxides. Examples of such salts include copper trichloroacetate, copper tribromoacetate, copper triiodoacetate, $Cu(CH_3COCHCOCF_3)_2$, $Cu(OOCC_7H_{15})_2$, $Cu(CF_3COCHCOF_3)_2$, $Cu(CH_3COCHCOCH_3)_2$, $Cu(CH_3CH_2CO_2CHCOCH_3)_2$, $CuO(C_5H_6N)_2$ and $Cu_3O_3Ba_2(O—CH_2CF_3)_4$. In certain embodiments, the transition metal salt is a carboxylate salt (e.g., a nonhalogenated carboxylate salt), such as a propionate salt of the transition metal (e.g., a nonhalogenated propionate salt of the transition metal). An example of a nonhalogenated propionate salt of a transition metal is $CU(O_2CC_2H_5)_2$. In some embodiments, the transition metal salt is a simple salt, such as copper sulfate, copper nitrate, copper iodide and/or copper oxylate. In some embodiments, n and/or m can have the value zero. In certain embodiments, a and/or b can have the value zero. An illustrative and nonlimiting list of Lewis bases includes nitrogen-containing compounds, such as ammonia and amines. Examples of amines include $CH_3CN$, $C_5H_5N$ and $R_1R_2R_3N$. Each of $R_1$ $R_2$, $R_3$ is independently H, an alkyl group (e.g., a straight chained alkyl group, a branched alkyl group, an aliphatic alkyl group, a non-aliphatic alkyl group and/or a substituted alkyl group) or the like. Without wishing to be bound by theory, it is believed that the presence of a Lewis base in the metal salt solution can reduce cross-linking of copper during intermediate formation. It is believed that this is achieved because a Lewis base can coordinate (e.g., selective coordinate) with copper ions, thereby reducing the ability of copper to cross-link.

Typically, the metal salt solution is applied to a surface (e.g., a buffer layer surface), such as by spin coating, dip coating, web coating, slot coating, gravure coating, or other techniques known to those skilled in the art, and subsequently heated.

The deposited solution is then heated to provide the superconductor material (e.g., YBCO). Without wishing to be bound by theory, it is believed that, in some embodiments when making YBCO, the solution is first converted to barium fluoride, the superconductor precursor is converted to a BaO superconductor intermediate, and the BaO superconductor intermediate is then converted to YBCO.

In certain embodiments, formation of barium fluoride involves heating the dried solution from about room temperature to about 200° C. at a rate of about 5° C. per minute in a nominal gas environment having a total gas pressure of about 760 torr, and containing from about five torr to about 50 torr of water and from about 0.1 torr to about 760 torr of oxygen, with the balance inert gas (e.g., nitrogen, argon). The temperature is then ramped from about 200° C. to about 220° C. at a rate of at least about 1° C. per minute (e.g., at least about 5° C. per minute, at least about 10° C. per minute, at least about 15° C. per minute, at least about 20° C. per minute) while maintaining substantially the same nominal gas environment.

In certain of these embodiments, barium fluoride is formed by heating the dried solution in moist oxygen (e.g., having a dew point in the range of from about 20° C. to about 75° C.) to a temperature in the range of from about 300° C. to about 500° C.

In alternate embodiments, barium fluoride is formed by heating the dried solution from an initial temperature (e.g., room temperature) to a temperature of from about 190° C. to about 215° C. (e.g., about 210° C.) in a water vapor pressure of from about 5 Torr to about 50 Torr water vapor (e.g., from about 5 Torr to about 30 Torr water vapor, or from about 10 Torr to about 25 Torr water vapor). The nominal partial pressure of oxygen can be, for example, from about 0.1 Torr to about 760 Torr. In these embodiments, heating is then continued to a temperature of from about 220° C. to about 290° C. (e.g., about 220° C.) in a water vapor pressure of from about 5 Torr to about 50 Torr water vapor (e.g., from about 5 Torr to about 30 Torr water vapor, or from about 10 Torr to about 25 Torr water vapor). The nominal partial pressure of oxygen can be, for example, from about 0.1 Torr to about 760 Torr. This is followed by heating to about 400° C. at a rate of at least about 2° C. per minute (e.g., at least about 3° C. per minute, or at least about 5° C. per minute) in a water vapor pressure of from about 5 Torr to about 50 Torr water vapor (e.g., from about 5 Torr to about 30 Torr water vapor, or from about 10 Torr to about 25 Torr water vapor) to form barium fluoride. The nominal partial pressure of oxygen can be, for example, from about 0.1 Torr to about 760 Torr.

In other embodiments, heating the dried solution to form barium fluoride includes one or more steps in which the temperature is held substantially constant (e.g., constant within about 10° C., within about 5° C., within about 2° C., within about 1° C.) for a relatively long period of time (e.g., more than about one minute, more than about five minutes, more than about 30 minutes, more than about an hour, more than about two hours, more than about four hours) after a first temperature ramp to a temperature greater than about room temperature. In these embodiments, heating the metal salt solution can involve using more than one gas environment (e.g., a gas environment having a relatively high water vapor pressure and a gas environment having a relatively low water vapor pressure) while maintaining the temperature substantially constant (e.g., constant within about 10° C., within about 5° C., within about 2° C., within about 1° C.) for a relatively long period of time (e.g., more than about one minute, more than about five minutes, more than about 30 minutes, more than about an hour, more than about two hours, more than about four hours). As an example, in a high water vapor pressure environment, the water vapor pressure can be from about 5 Torr to about 40 Torr (e.g., from about 25 Torr to about 38 Torr, such as about 32 Torr). A low water vapor pressure environment can have a water vapor pressure of less than about 1 Torr (e.g., less than about 0.1 Torr, less than about 10 milliTorr, about five milliTorr).

In certain embodiments, heating the dried solution to form barium fluoride can include putting the coated sample in a pre-heated furnace (e.g., at a temperature of at least about 100° C., at least about 150° C., at least about 200° C., at most about 300° C., at most about 250° C., about 200° C.). The gas environment in the furnace can have, for example, a total gas pressure of about 760 Torr, a predetermined partial pressure of water vapor (e.g. at least about 10 Torr, at least about 15 Torr, at most about 25 Torr, at most about 20 Torr, about 17 Torr) with the balance being molecular oxygen. After the coated sample reaches the furnace temperature, the furnace temperature can be increased (e.g., to at least about 225° C., to at least about 240° C., to at most about 275° C., to at most about 260° C., about 250° C.) at a predetermined temperature ramp rate (e.g., at least about 0.5° C. per minute, at least about 0.75° C. per minute, at most about 2° C. per minute, at most about 1.5° C. per minute, about 1° C. per minute). This step can be performed with the same nominal gas environment used in the first heating step. The temperature of the furnace can then be further increased (e.g., to at least about 350° C., to at least about 375° C., to at most about 450° C., to at most about 425° C., about 450° C.) at a predetermined temperature ramp rate (e.g., at least about 5° C. per minute, at least about 8° C. per minute, at most about 20° C. per minute, at most about 12° C. per minute, about 10° C. per minute). This step can be performed with the same nominal gas environment used in the first heating step.

In some embodiments, preparation of a superconductor material can involve slot coating the metal salt solution (e.g., onto a tape, such as a tape formed of a textured nickel tape having sequentially disposed thereon epitaxial buffer and/or cap layers, such as $Gd_2O_3$, YSZ and $CeO_2$). The coated metal salt solution can be deposited in an atmosphere containing $H_2O$ (e.g., from about 5 torr $H_2O$ to about 15 torr $H_2O$, from about 9 torr $H_2O$ to about 13 torr $H_2O$, about 11 torr $H_2O$) The balance of the atmosphere can be an inert gas (e.g., nitrogen). The total pressure during film deposition can be, for example, about 760 torr. The film can be decomposed, for example, by transporting the coated tape through a tube furnace (e.g., a tube furnace having a diameter of about 2.5 inches) having a temperature gradient. The respective temperatures and gas atmospheres of the gradients in the furnace, as well as the transport rate of the sample through each gradient, can be selected so that the processing of the film is substantially the same as according to the above-noted methods.

The foregoing treatments of a metal salt solution can result in barium fluoride. Preferably, the precursor has a relatively low defect density.

In particular embodiments, methods of treating the solution can be employed to minimize the formation of undesirable a-axis oriented oxide layer grains, by inhibiting the formation of the oxide layer until the required reaction conditions are attained.

While solution chemistry for barium fluoride formation has been disclosed, other methods can also be used. For example, solid-state, or semi solid state, precursor materials deposited in the form of a dispersion. These precursor compositions allow for example the substantial elimination of $BaCO_3$ formation in final YBCO superconducting layers, while also allowing control of film nucleation and growth. Two general approaches are presented for the formulation of such precursor compositions.

In one approach, the cationic constituents of the precursor composition are provided in components taking on a solid form, either as elements, or preferably, compounded with other elements. The precursor composition is provided in the form of ultrafine particles, which are dispersed so that they can be coated onto and adhere onto the surface of a suitable substrate, intermediate-coated substrate, or buffer-coated substrate. These ultrafine particles can be created by aerosol spray, by evaporation or by similar techniques, which can be controlled to provide the chemical compositions and sizes, desired. The ultrafine particles are less than about 500 nm, preferably less than about 250 nm, more preferably less than about 100 nm and even more preferably less than about 50 nm. In general, the particles are less than about 50% the thickness of the desired final film thickness, preferably less than about 30% most preferably less than about 10% of the thickness of the desired final film thickness. For example, the precursor composition can comprise ultrafine particles of one or more of the constituents of the superconducting layer in a substantially stoichiometric mixture, present in a carrier. This carrier comprises a solvent, a plasticizer, a binder, a dispersant, or a similar system known in the art, to form a dispersion of such particles. Each ultrafine particle can contain a substantially compositionally uniform, homogeneous mixture of such constituents. For example, each particle can contain $BaF_2$, and rare-earth oxide, and copper oxide or rare earth/barium/copper oxyfluoride in a substantially stoichiometric mixture. Analysis of such particles would desirably reveal a rare-earth:barium:copper ratio as substantially 1:2:3 in stoichiometry, with a fluorine:barium ratio of substantially 2:1 in stoichiometry. These particles can be either crystalline, or amorphous in form.

In a second approach, the precursor components can be prepared from elemental sources, or from a substantially stoichiometric compound comprising the desired constituents. For example, evaporation of a solid comprising a substantially stoichiometric compound of desired REBCO constituents (for example, $YBa_2Cu_3O_{7-x}$) or a number of solids, each containing a particular constituent of the desired final superconducting layer (for example, $Y_2O_3$, $BaF_2$, CuO) could be used to produce the ultrafine particles for production of the precursor compositions. Alternatively, spray drying or aerosolization of a metalorganic solution comprising a substantially stoichiometric mixture of desired REBCO constituents could be used to produce the ultrafine particles used in the precursor compositions. Alternatively, one or more of the cationic constituents can be provided in the precursor composition as a metalorganic salt or metalorganic compound, and can be present in solution. The metalorganic solution can act as a solvent, or carrier, for the other solid-state elements or compounds. According to this embodiment, dispersants and/or binders can be substantially eliminated from the precursor composition. For example, the precursor composition can comprise ultrafine particles of rare-earth oxide and copper oxide in substantially a 1:3 stoichiometric ratio, along with a solublized barium-containing salt, for example, barium-trifluoroacetate dissolved in an organic solvent, such as methanol.

If the superconducting layer is of the REBCO type, the precursor composition can contain a rare earth element, barium, and copper in the form of their oxides; halides such as fluorides, chlorides, bromides and iodides; carboxylates and alcoholates, for example, acetates, including trihaloacetates such as trifluroracetates, formates, oxalates, lactates, oxyfluorides, propylates, citrates, and acetylacetonates, and, chlorates and nitrates. The precursor composition can include any combination of such elements (rare earth element, barium, and copper) in their various forms, which can convert to an intermediate containing a barium halide, plus rare earth oxyfluoride and copper(oxyfluoride) without a separate decomposition step or with a decomposition step that is substantially shorter than that which may be required for precursors in which all constituents are solubilized, and without substantial formation of $BaCO_3$, and which can subsequently be treated using high temperature reaction processes to yield an epitaxial REBCO film with $T_c$ of no less than about 89K, and $J_c$ greater than about 500,000 $A/cm^2$ at a film thickness of 1 micron or greater. For example, for a $YBa_2Cu_3O_{7-x}$ superconducting layer, the precursor composition could contain barium halide (for example, barium fluoride), yttrium oxide (for example, $Y_2O_3$), and copper oxide; or yttrium oxide, barium trifluoroacetate in a trifluoroacetate/methanol solution, and a mixture of copper oxide and copper trifluoroacetate in trifluoroacetate/methanol. Alternatively, the precursor composition could contain Ba-trifluoroacetate, $Y_2O_3$, and CuO. Alternatively, the precursor composition could contain barium trifluoroacetate and yttrium trifluoroacetate in methanol, and CuO. Alternatively, the precursor composition could contain $BaF_2$ and yttrium acetate and CuO. In some preferred embodiments, barium-containing particles are present as $BaF_2$ particles, or barium fluoroacetate. In some embodiments the precursor could be substantially a solublized metalorganic salt containing some or all of the cation constituents, provided at least a portion of one of the compounds containing cation constituents present in solid form. In certain embodiments, the precursor in a dispersion includes a binder and/or a dispersant and/or solvent(s).

The precursor compositions can be applied to substrate or buffer-treated substrates by a number of methods, which are designed to produce coatings of substantially homogeneous thickness. For example, the precursor compositions can be applied using spin coating, slot coating, gravure coating, dip coating, tape casting, or spraying. The substrate is desirably uniformly coated to yield a superconducting film of from about 1 to 10 microns, preferably from about 1 to 5 microns, more preferably from about 2 to 4 microns.

More details are provided in PCT Publication No. WO 01/08236, published on Feb. 1, 2001, and entitled "Coated Conductor Thick Film Precursor."

In preferred embodiments, a superconductor layer is well-ordered (e.g., biaxially textured in plane, or c-axis out of plane and biaxially textured in plane). In embodiments, the bulk of the superconductor material is biaxially textured. A superconductor layer can be at least about one micrometer thick (e.g., at least about two micrometers thick, at least about three micrometers thick, at least about four micrometers thick, at least about five micrometers thick).

The invention is described with reference to the following examples, which are presented for the purpose of illustration only.

EXAMPLE 1

Growth of Ceria ($CeO_2$) Buffer Layer on a Lanthanum Zirconate (LZO) Seed Layer Deposition of a LZO seed layer. Deposition of LZO seed layer on a nickel tungsten (NiW) substrate is accomplished from a metal alkoxide precursor solution. The solution is prepared from a stoichiometric mixture of lanthanum methoxyethoxide and zirconium methoxyethoxide in methoxyethanol. The LZO precursor is deposited onto a biaxially textured NiW substrate with a thickness of about 25–100 nm. The LZO precursor is decomposed and the LZO phase is nucleated on the NiW substrate at a temperature of about 1100° C. in a forming gas environment. The LZO forms an epitaxial layer under these conditions.

Deposition of a $CeO_2$ buffer layer. The $CeO_2$ buffer layer is deposited on the surface of the LZO seed layer. The $CeO_2$ precursor can be a nitrate or acetate precursor or any other appropriate precursor from which $CeO_2$ is formed. The $CeO_2$ precursor film is spin coated onto the LZO film at 2000 rpm and decomposed within 5–15 min at 1000° C. The $CeO_2$ phase is nucleated on the LZO layer in a humid $H_2$/Ar environment having an $H_2O$ partial pressure of 22.5–40 torr in forming gas. In addition to lowering the nucleation temperature of the $CeO_2$, the process conditions also promote the formation of a $CeO_2$ surface morphology that is relatively atomically flat and has a high number of termination planes with the desired orientation.

EXAMPLE 2

Growth of a $CeO_2$ Layer on a Substrate

A 0.2 M Ce solution is prepared by dissolving a 0.7 g of anhydrous cerium(III)acetate ($Ce(OAc)_3$) in 10 mL of a 97:3 methanol:propionic acid solvent system. The solution was spin-coated at 2000 rpm onto two NiW substrates onto which had been previously deposited a layer of 50 nm $Y_2O_3$ using e-beam evaporation as a deposition technique. The coated layers were heated for 15 minutes at 900° C. and 1100° C., respectively, in an atmosphere containing 3% water ($P_{H2O}$, 22.5 torr) to form a (002) textured $CeO_2$ layer of 70–100 nm thickness. The introduction of 3% water in the processing atmosphere retained (002) texture as was determined by x-ray diffration. Pole figures confirmed that the $CeO_2$ layer was in-plane textured.

Figure 5A:
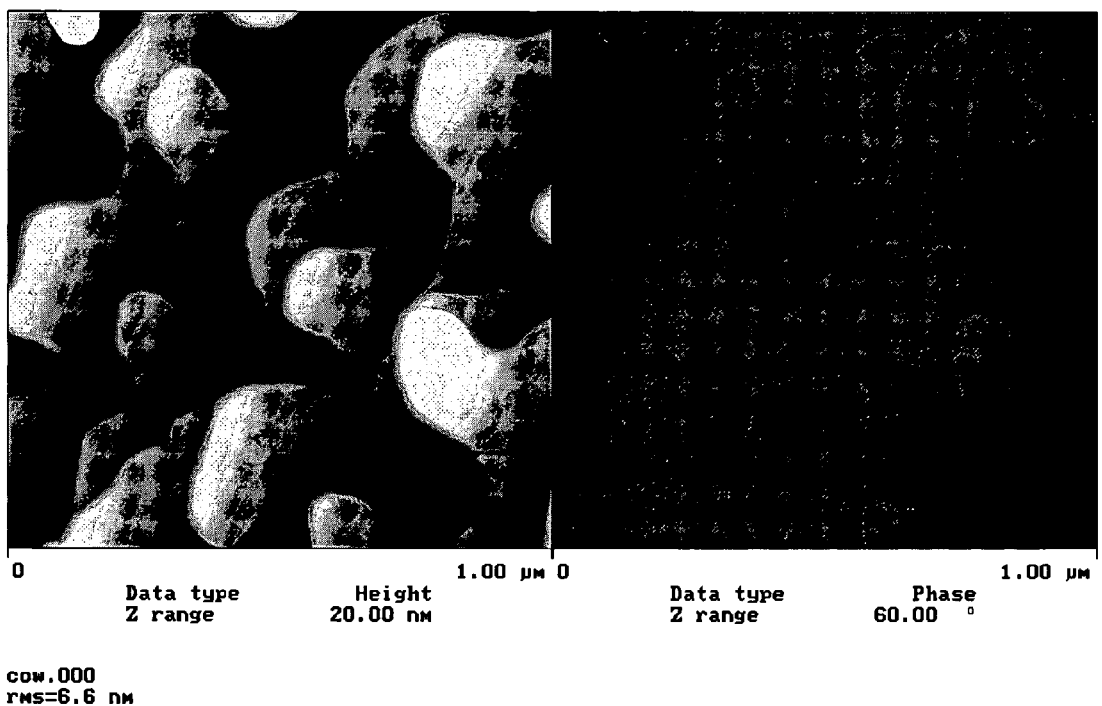
FIG. 5A–5B illustrate a series of atomic force microscopy (AFM) micrographs illustrating the surface morphology of a ceria layer prepared according to one or more embodiments of the present invention.
Figure 5B:
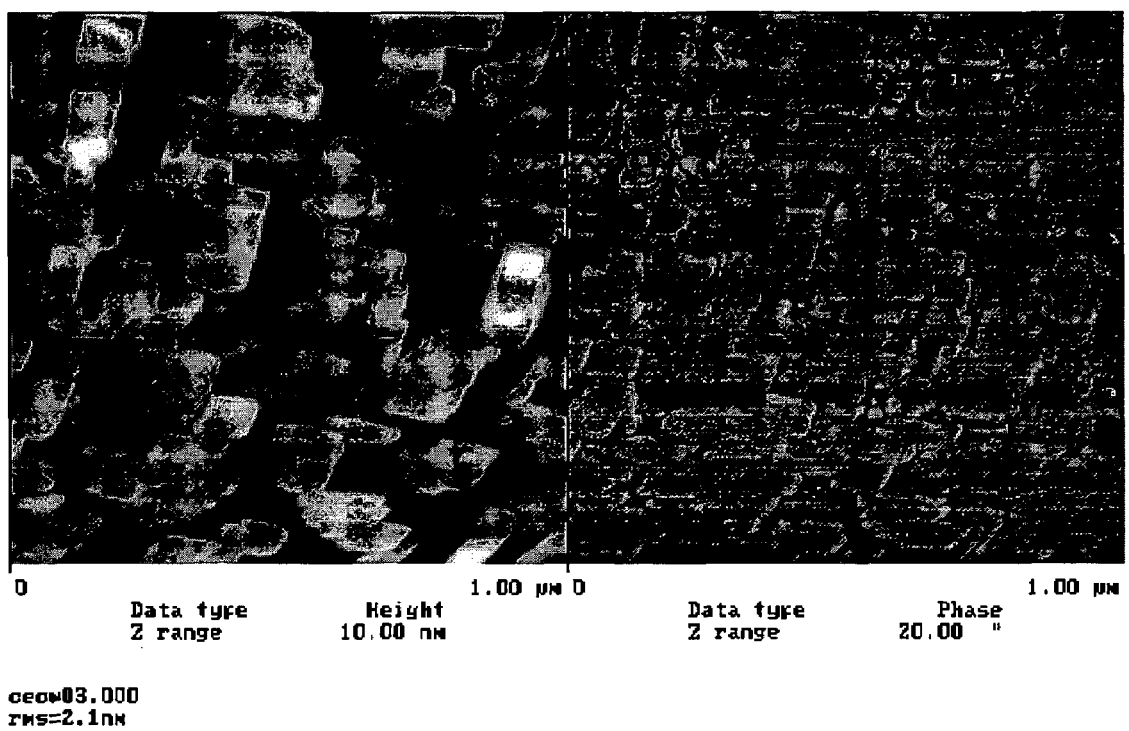

Atomic force microscopy (AFM) was used to probe the surface morphology of the $CeO_2$ layer. AFM micrographs in FIG. 5a (for sample treated at 1100° C.) and FIG. 5b (for sample treated at 900° C.) clearly show the desired termination layers of $CeO_2$ separated by up to 10 nm high steps within a 1×1 µm² area. The termination layers themselves are atomically smooth and allow for good nucleation of the subsequent layer. The surface roughness is well below 10 nm rms over a 1×1 µm² area.

EXAMPLE 3

Figure 6:
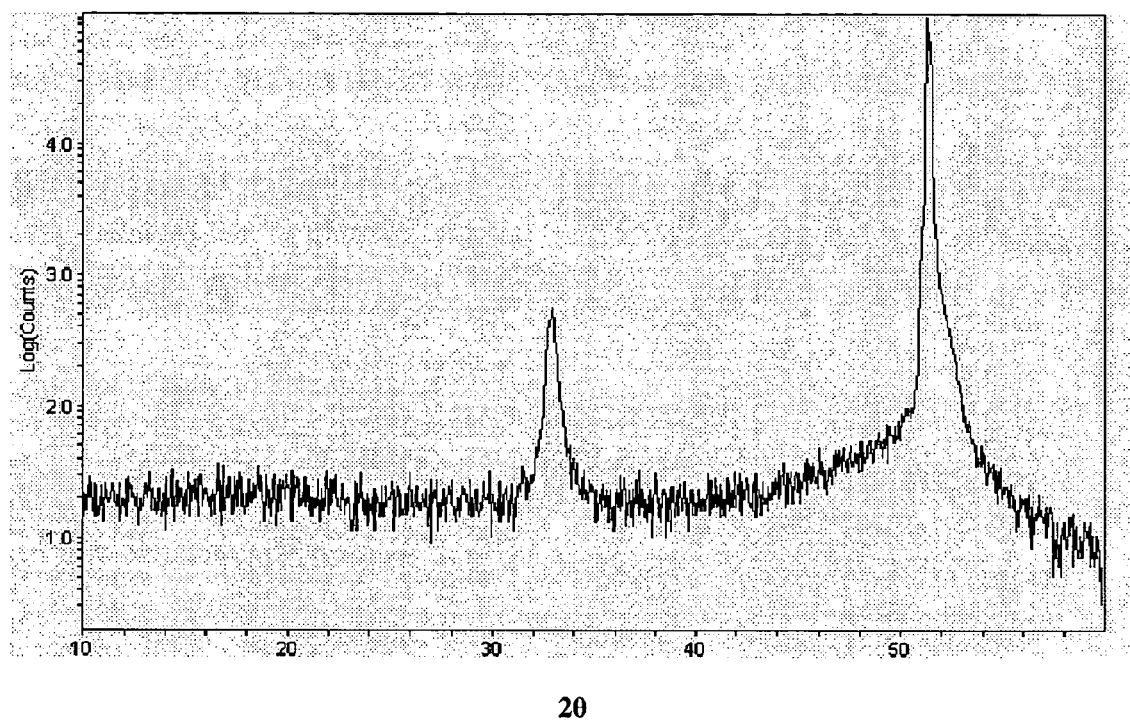
FIG. 6 is a x-ray diffraction (XRD) pattern of a $La_2Zr_2O_7$ film grown directly on a NiW substrate in a forming gas environment.

Growth of a $La_2Zr_2O_7$ (LZO) Layer on a NiW Substrate in a Reducing Atmosphere The coating solution was prepared from a stoichiometric mixture of La methoxyethoxide (0.25 mole/liter) and Zr methoxyethodide (0.25 mole/liter) in methoxyethanol. The coating solution was deposited onto a biaxially textured NiW substrate with a thickness of to yield a $La_2Zr_2O_7$ film about 50 nm thick. The coating was decomposed by heating for 5–15 minutes at about 1100° C. in a forming gas atmosphere. The $La_2Zr_2O_7$ formed with a single 400 texture as shown in the x-ray diffraction (XRD) pattern in FIG. 6. The peak at approximately 52° (2θ) is the (400) peak of the NiW substrate, and the peak at approximately 33° (2θ) is attributed to the (400) peak of the LZO layer. Thus, an LZO is epitaxially deposited onto a metal surface under reducing conditions.

EXAMPLE 4

Growth of a La2Zr2O7 Layer on a NiW Substrate in Oxidizing Atmosphere

Figure 7:
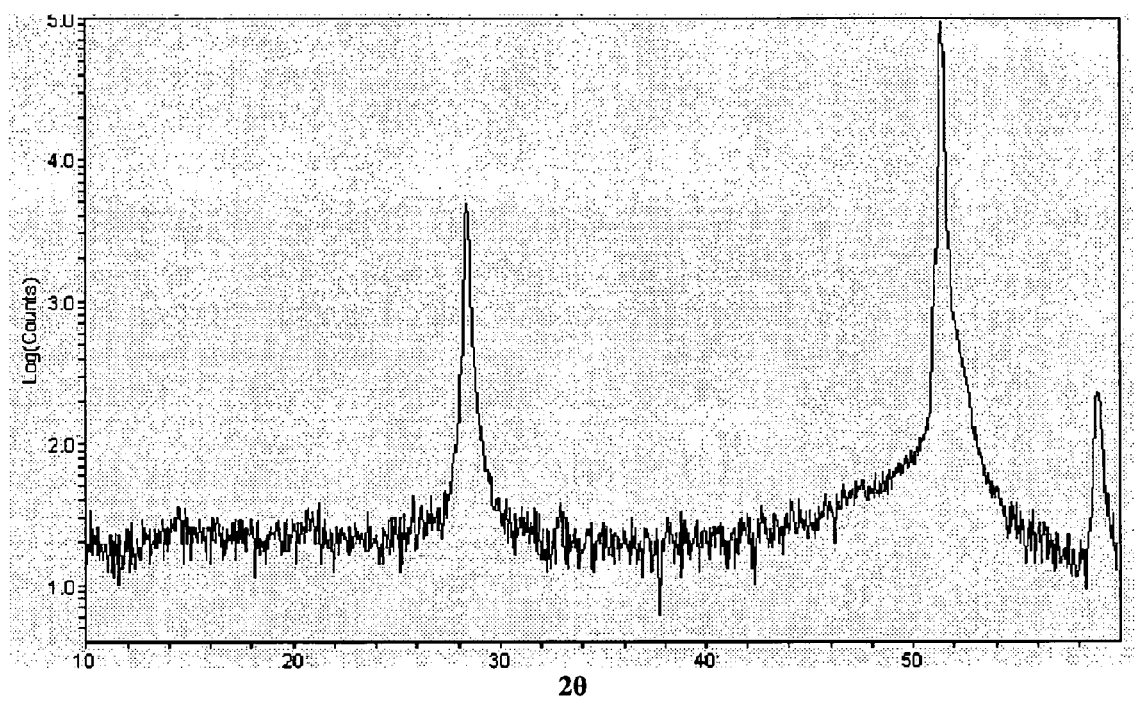
FIG. 7 is a x-ray diffraction (XRD) pattern of a $La_2Zr_2O_7$ film grown directly on a NiW substrate in a forming gas environment containing 4 torr $H_2O$.

A coating prepared as described in Example 3 was deposited on a NiW substrate. The coating was decomposed by heating for 5–15 minutes at about 1100° C. in a forming gas atmosphere containing about 4 torr $H_2O$. The $La_2Zr_2O_7$ formed with a single 222 texture as shown in FIG. 7, as established by the absence of any peak at about 33° (2θ) and the presence of the (222) peak at about 29(2θ). Thus, an epitaxial layer was not formed from by coating the precursor layer directly onto the metal substrate under oxidizing conditions.

EXAMPLE 5

Growth of a Second $La_2Zr_2O_7$ Layer on $La_2Zr_2O_7$/NiW Substrate

Figure 8:
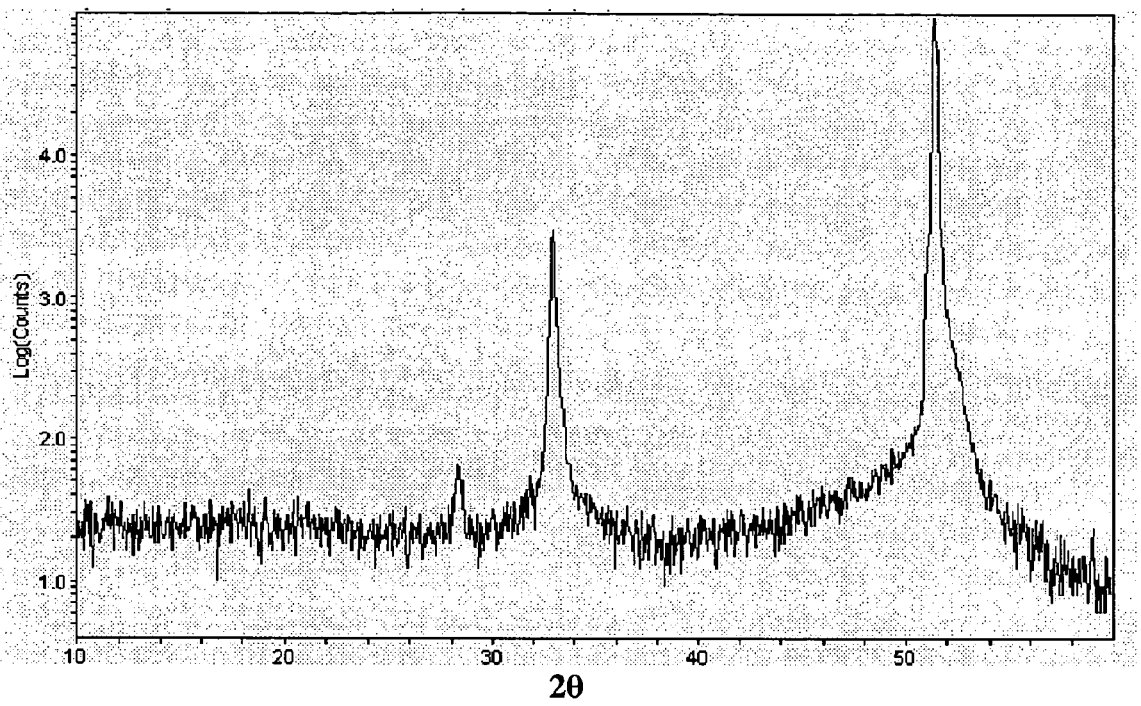
FIG. 8 is a x-ray diffraction (XRD) pattern of a second $La_2Zr_2O_7$ film grown in a forming gas environment containing 4 torr $H_2O$ on a first $La_2Zr_2O_7$ layer having 400 texture.

A first $La_2Zr_2O_7$ layer was prepared as described in Example 3. A second coating, prepared as described in Example 3 was deposited on the first $La_2Zr_2O_7$ layer. The second coating was decomposed by heating for 5–15 minutes at about 1100° C. in a forming gas atmosphere containing about 4 torr $H_2O$. The $La_2Zr_2O_7$ formed with a predominately a 400 texture as shown in FIG. 8.

INCORPORATION BY REFERENCE

The following documents are hereby incorporated by reference.

U.S. Pat. No. 5,340,794, issued Aug. 23, 1994, and entitled "Flux Pinning In Superconducting Cuprates," U.S. Pat. No. 6,202,287, issued on Mar. 20, 2001, and entitled "Method For Producing Biaxially Aligned Superconducting Ceramics," PCT Publication No. WO 98/58415, published on Dec. 23, 1998, and entitled "Controlled Conversion of Metal Oxyfluorides into Superconducting Oxides," U.S. patent application Ser. No. 08/943,047, filed on Oct. 1, 1997, and entitled "Substrates With Improved Oxidation Resistance" U.S. Pat. No. 6,428,635, issued on Aug. 6, 2002, and entitled "Substrates For Superconductors," U.S. Pat. No. 6,027,564, issued Feb. 22, 2000, and entitled "Low Vacuum Process for Producing Epitaxial Layers," U.S. Pat. No. 6,669,774, issued on Dec. 30, 2003, and entitled "Methods And Compositions For Making A Multi-Layer Article," U.S. Pat. No. 6,022,832, issued Feb. 8, 2000, and entitled "Low Vacuum Process for Producing Superconductor Articles with Epitaxial Layers," U.S. application Ser. No. 09/007,372, filed on Jan. 15, 1998 entitled "Low Vacuum Process for Producing Superconductor Articles with Epitaxial Layers," U.S. application Ser. No. 09/007,373, filed on Jan. 15, 1998 entitled "Superconductor Particles with Epitaxial Layers," U.S. patent application Ser. No. 09/617,518, filed on Jul. 14, 2000, and entitled, "Enhanced High Temperature Coated Superconductors Joined At A Cap Layer;" U.S. Pat. No. 6,458,223, issued on Oct. 1, 2002, and entitled "Alloy Materials;" U.S. Pat. No. 6,475,311, issued on Nov. 5, 2002, and entitled "Alloy Materials;" U.S. patent application Ser. No. 09/616,810, filed on Jul. 14, 2000, and entitled, "Multi-Layer Articles And Methods For Making Same;" U.S. Pat. No. 6,562,761, issued on May 13, 2003, and entitled "Coated Conductor Thick Film Precursor;" U.S. Pat. No. 6,190,752, issued Feb. 20, 2001, and entitled "Thin Films Having Rock-Salt-Like Structure Deposited on Amorphous Surfaces,' U.S. patent application Ser. No. 09/615,999, filed on Jul. 14, 2000, and entitled, "Multi-Layer Articles And Methods For Making Same;" U.S. patent application Ser. No. 09/616,570, filed on Jul. 14, 2000, and entitled, "Surface Control Alloy Substrates And Methods Of Manufacture Therefor;" U.S. Pat. No. 5,231,074, issued Jul. 27, 1993, and entitled "Preparation Of Highly Textured Oxide Superconducting Films From Mod Precursor Solutions,' U.S. Pat. No. 6,673,387, issued Jan. 6, 2004, and entitled "Control Of Oxide Layer Reaction Rates," U.S. Pat. No. 6,537,689, issued Mar. 25, 2003, and entitled "Multi-Layer Superconductor Having Buffer Layer With Oriented Termination Plane," U.S. patent application Ser. No. 09/855,312, filed on May 14, 2001, and entitled, "Precursor Solutions And Methods Of Using Same;" U.S. patent application Ser. No. 10/208,134, filed on Jul. 30, 2002, and entitled "Superconductor Methods and Reactor;" U.S. patent application Ser. No. 10/194,561, filed on Jul. 13, 2002, and entitled "Vacuum Processing For Fabrication Of Superconducting Films Fabricated By Metal-Organic Processing;" U.S. patent application Ser. No. 09/995,442, filed on Nov. 28, 2001, and entitled "Superconductor Cables And Magnetic Devices" U.S. Provisional Patent Application Ser. No. 60/447,613, filed on Jun. 10, 2003, and entitled "Superconductor Methods And Reactors;" U.S. patent application Ser. No. 10/624,026, filed on Jul. 21, 2003, and entitled, "High Temperature Superconducting Devices And Related Methods;" U.S. patent application Ser. No. 10/758,710, filed on Jan. 16, 2004, and entitled "Oxide Films with Nanodot Flux Pinning Centers;"

What is claimed is:

1. A method of making a multilayer article, comprising:
  depositing a first material on the surface of a metal substrate to form a biaxially textured seed layer of the first material, the first material being deposited under reducing conditions relative to the metal substrate; and
  epitaxially depositing a metal oxide over the seed layer wherein the metal oxide is deposited from a solution-based precursor to form a second layer under second conditions that are more oxidizing than the reducing conditions used in the deposition of the first material, and
  wherein the atmosphere of the second conditions comprises a water partial pressure in the range of about 4 torr to about 40 torr.

2. A method of making a multilayer article, comprising:
  depositing a first material on the surface of a metal substrate to form a biaxially textured seed layer of the first material, the first material being deposited under reducing conditions relative to the metal substrate; and
  epitaxially depositing a ceria layer having a termination plane over the seed layer, at least 25% of the termination plane of the ceria layer comprising the (001) plane, wherein the ceria layer is deposited from a solution-based precursor under second conditions that are more oxidizing than the reducing conditions used in the deposition of the first material, and
  wherein the atmosphere of the second conditions comprises a water partial pressure in the range of about 4 torr to about 40 torr.

3. The method of claim 1 or 2, wherein the reducing conditions for depositing the first material comprise an oxygen partial pressure less than about $10^{-15}$ atm.

4. The method of claim 1 or 2, wherein the reducing conditions for depositing the first material comprise an oxygen partial pressure less than about $10^{-21}$ atm.

5. The method of claim 1 or 2, wherein the reducing conditions for the deposition of the first layer comprises forming gas.

6. The method of claim 5, wherein the reducing conditions for the first layer comprise heating at a temperature in the range of about 400° C. to about 1200° C.

7. The method of claim 1 or 2, wherein reducing conditions for the first layer comprise heating in an atmosphere of hydrogen and water.

8. The method of claim 7, wherein the ratio of the partial pressure of water to the partial pressure of hydrogen during formation the first material is in the range of about 0.1 to about 0.5 at a temperature of about 800° C. to about 1100C.

9. The method of claim 1 or 2, wherein the first layer is epitaxially deposited.

10. The method of claim 1 or 2, wherein the first material is deposited using a technique selected from the group consisting of sputtering, e-beam deposition, ion beam assisted deposition, physical vapor deposition, physical laser deposition, chemical vapor deposition, and metal organic deposition.

11. The method of claim 1 or 2, wherein the first material is selected from the group consisting of metals, metal oxides, and metal nitrides that have crystalline surfaces that are stable under the second deposition conditions that are oxidizing relative to the underlying substrate.

12. The method of claim 1 or 2, wherein the first material is selected from the group consisting silver, gold, palladium, nickel, $CeO_2$, $Y_2O_3$, $TbO_x$, $GaO_x$, YSZ, $LaAlO_3$, $SrTiO_3$, $Gd_2O_3$, $LaNiO_3$, $LaCuO_3$, $NdGaO_3$, $NdAlO_3$, MgO, $CaF_2$, AlN, NbN, TiN, VN, ZrN, YN, NiO, Ag, $Al_2O_3$, $SmBa_2Cu_3O_x$, $MgF_2$, $LaMnO_3$, $La_{0.66}Ca_{0.33}MnO_3$, $La_{0.66}Sr_{0.33}MnO_3$, $La_{0.66}Ba_{0.33}Mn_3$, $La_2Zr_2O_7$, $Gd_2Zr_2O_7$, $Ba_2Zr_2O_7$ and doped compounds thereof.

13. The method of claim 1 or 2, wherein the second conditions for the second layer comprise an oxygen partial pressure in the range of about $10^{-21}$ atm to about $10^{-12}$ atm.

14. The method of claim 1 or 2, wherein the water partial pressure is in the range of about 4 torr to about 25 torr.

15. The method of claim 1 or 2, wherein the water partial pressure is in the range of about 10 torr to about 25 torr.

16. The method of claim 1 or 2, wherein the second conditions comprise heating the metal oxide in an atmosphere comprising hydrogen and water.

17. The method of claim 16, wherein second conditions comprise a total pressure in the range of 30 torr to 760 torr and a water partial pressure in the range of about 4 torr to about 40 torr and a hydrogen partial pressure in the range of about 20 torr to about 50 torr, the balance being an inert carrier gas.

18. The method of claim 17, wherein the water partial pressure is in the range of about 4 torr to about 25 torr.

19. The method of claim 16, wherein the ratio of the partial pressure of water to the partial pressure of hydrogen in deposition the metal oxide is in the range above about 0.1 to about 1 at a temperature of about 800° C. to about 1100° C.

20. The method of claim 16, wherein said second conditions comprise heating at a temperature about 700° C. to about 1200° C.

21. The method of claim 1, wherein the metal oxide forms a buffer layer.

22. The method of claim 1, wherein the second material metal oxide is selected from the group of metal oxides consisting of $CeO_2$, $Y_2O_3$, $TbO_x$, $GaO_x$, YSZ, $LaAlO_3$, $SrTiO_3$, $Gd_2O_3$, $LaNiO_3$, $LaCuO_3$, $NdGaO_3$, $NdAlO_3$, MgO, NiO, $Al_2O_3$, $SmBa_2Cu_3O_x$, $LaMnO_3$, $La_{0.66}Ca_{0.33}MnO_3$, $La_{0.66}Sr_{0.33}MnO_3$, $La_{0.66}Ba_{0.33}Mn_3O_3$, $La_2Zr_2O_7$, $Gd_2Zr_2O_7$, $Ba_2Zr_2O_7$, and $Y_2Ce_2O_7$ and doped compounds thereof.

23. The method of claim 1, wherein the second layer is deposited to a thickness of about five nanometers to about 300 nm.

24. The method of claim 2, wherein the ceria layer is deposited to a thickness of about five nanometers to about 300 nm.

25. The method of claim 1, wherein the second layer has a surface smoothness in the range of about 1 nm to about 1 nm rms.

26. The method of claim 2, wherein at least 75% of the termination plane of the $CeO_2$ layer comprises the (001) plane.

27. The method of claim 1, further comprising depositing one or more intermediate layers between the first seed layer and the second layer.

28. The method of claim 2, further comprising depositing one or more intermediate layers between the first seed layer and the ceria layer.

29. The method of claim 27 or 28, wherein the intermediate layer is epitaxially deposited from a solution-based precursor under third conditions that are more oxidizing than the reducing conditions used in the deposition of the first material, and the third conditions comprise a water partial pressure in the range of about 4 torr to about 40 torr.

30. The method of claim 27 or 28, wherein the intermediate layer is deposited using a technique selected from the group consisting of sputtering, e-beam deposition, ion beam assisted deposition, physical vapor deposition, physical laser deposition, chemical vapor deposition, and metal organic deposition.

31. The method of claim 1, further comprising depositing a cap material as a layer on the second layer.

32. The method of claim 2, further comprising depositing a cap material as a layer on the ceria layer.

33. The method of claim 31 or 32, wherein the cap layer is epitaxially deposited from a solution-based precursor under third conditions that are more oxidizing than the reducing conditions used in the deposition of the first material, and the third conditions comprise a water partial pressure in the range of about 4 torr to 40 torr.

34. The method of claim 31 or 32, wherein the cap layer is deposited using a technique selected from the group consisting of sputtering, e-beam deposition, ion beam assisted deposition, physical vapor deposition, physical laser deposition, chemical vapor deposition, and metal organic deposition.

35. The method of claim 1, further comprising depositing a superconductor material on the second deposited layer.

36. The method of claim 2, further comprising depositing a superconductor material on the $CeO_2$ layer.

37. The method of claim 35 or 36, wherein the superconductor material comprises a rare earth oxide superconductor material.

38. The method of claim 35 or 36, wherein the rare earth oxide superconductor material comprises YBCO.

39. The method of claim 1 or 2, wherein the metal substrate is selected from the group consisting of nickel, silver, copper, zinc, aluminum, iron, chromium, vanadium, palladium, molybdenum and their alloys.

* * * * *